(12) United States Patent
Suzuki

(10) Patent No.: US 9,294,107 B2
(45) Date of Patent: Mar. 22, 2016

(54) PHASE LOCKED LOOP CIRCUIT, PHASE LOCKED LOOP MODULE, AND PHASE LOCKED LOOP METHOD

(71) Applicant: Sony Corporation, Tokyo (JP)

(72) Inventor: Norihito Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/459,934

(22) Filed: Aug. 14, 2014

(65) Prior Publication Data

US 2015/0070059 A1 Mar. 12, 2015

(30) Foreign Application Priority Data

Sep. 9, 2013 (JP) ................................ 2013-186043

(51) Int. Cl.
*H03L 7/06* (2006.01)
*H03L 7/093* (2006.01)
*H03L 7/089* (2006.01)

(52) U.S. Cl.
CPC ............... *H03L 7/093* (2013.01); *H03L 7/0891* (2013.01)

(58) Field of Classification Search
CPC ......... H03L 7/087; H03L 7/091; H03L 7/093; H03L 7/099; H03L 7/18
See application file for complete search history.

(56) References Cited

U.S. PATENT DOCUMENTS 4,661,844 A * 4/1987 Rufray et al. .................. 348/557
2008/0191759 A1 * 8/2008 Neurauter et al. ............ 327/157

FOREIGN PATENT DOCUMENTS

JP 10-178343 6/1998

* cited by examiner

*Primary Examiner* — Sibin Chen
(74) *Attorney, Agent, or Firm* — K&L Gates LLP

(57) ABSTRACT

Provided is a phase locked loop circuit that includes: a phase comparison section configured to compare a phase of a first clock signal and a phase of a second clock signal; a loop filter configured to generate a control voltage based on a comparison result by the phase comparison section; and a clock signal generation section configured to generate a clock signal having a frequency corresponding to the control voltage, and output the clock signal as the second clock signal. The loop filter includes a first resistor inserted between a first node on a signal path and a second node, a first capacitor inserted between the second node and a first DC power supply, a first switch inserted between the second node and a third node on the signal path, and a second capacitor inserted between the third node and a second DC power supply.

20 Claims, 19 Drawing Sheets

| PARAMETAR | SETTING EXAMPLE ||
|---|---|---|
| | OPERATION MODE M1 | OPERATION MODE M2 |
| Icp | I [mA] | I*100 [mA] |
| R31 | 100 [kohm] ||
| C32 | 100 [pF] ||
| C33 | 1 [pF] ||
| R34 | 1 [kohm] ||
| SW35 | OFF | ON |
| Cext | — | 10 [nF] |

| PARAMETER | SETTING EXAMPLE ||
|---|---|---|
| | OPERATION MODE M1 | OPERATION MODE M2 |
| Icp | I [mA] | I*100 [mA] |
| R1 | 100 [kohm] | 1 [kohm] |
| C0 | 1 [pF] | 101 [pF] |
| C1 | 100 [pF] | 10 [nF] |

| PARAMETER | SETTING EXAMPLE | |
|---|---|---|
| | OPERATION MODE M1 | OPERATION MODE M2 |
| Icp | I [mA] | I*100 [mA] |
| R31 | 100 [kohm] | |
| C32 | 100 [pF] | |
| C33 | 1 [pF] | |
| R34 | 1 [kohm] | |
| SW35 | OFF | ON |
| Cext | — | 10 [nF] |
| R36 | 100 [kohm] | |
| C37 | 1 [pF] | |

| PARAMETER | SETTING EXAMPLE | |
|---|---|---|
| | OPERATION MODE M1 | OPERATION MODE M2 |
| Icp | I [mA] | I*100 [mA] |
| R1 | 100 [kohm] | 1 [kohm] |
| C0 | 1 [pF] | 101 [pF] |
| C1 | 100 [pF] | 10 [nF] |
| R2 | 100 [kohm] | |
| C2 | 1 [pF] | |

| PARAMETER | SETTING EXAMPLE | |
| --- | --- | --- |
| | OPERATION MODE M1 | OPERATION MODE M2 |
| R31 | 100 [kohm] | |
| C32 | 100 [pF] | |
| C33 | 1 [pF] | |
| R34 | 1 [kohm] | |
| SW35 | OFF | ON |
| Cext | — | 10 [nF] |
| R41 | 1 [Mohm] | |
| R42 | 10.1 [kohm] | |
| SW43 | OFF | ON |

| PARAMETER | SETTING EXAMPLE | |
| --- | --- | --- |
| | OPERATION MODE M1 | OPERATION MODE M2 |
| R0 | 1 [Mohm] | 10 [kohm] |
| R1 | 100 [kohm] | 1 [kohm] |
| C0 | 1 [pF] | 101 [pF] |
| C1 | 100 [pF] | 10 [nF] |

| PARAMETER | SETTING EXAMPLE | |
| --- | --- | --- |
| | OPERATION MODE M1 | OPERATION MODE M2 |
| Icp | I [mA] | I*100 [mA] |
| Rext1 | — | 1 [kohm] |
| Cext0 | — | 100 [pF] |
| Cext1 | — | 10 [nF] |
| R51 | 100 [kohm] | |
| R52 | 1.01 [kohm] | |
| SW53 | OFF | ON |
| C54 | 100 [pF] | |
| R55 | 100 [kohm] | |
| SW56 | ON | OFF |
| SW57 | OFF | ON |
| C58 | 1 [pF] | |
| C59 | 1 [pF] | |

FIG. 22A

| PARAMETER | SETTING EXAMPLE | |
| --- | --- | --- |
| | OPERATION MODE M1 | OPERATION MODE M2 |
| Icp | I [mA] | I*100 [mA] |
| R1 | 100 [kohm] | 1 [kohm] |
| R2 | 100 [kohm] | 1 [kohm] |
| C0 | 1 [pF] | 101 [pF] |
| C1 | 100 [pF] | 10 [nF] |
| C2 | 1 [pF] | 101 [pF] |

FIG. 22B

| PARAMETER | SETTING EXAMPLE | |
|---|---|---|
| | OPERATION MODE M1 | OPERATION MODE M2 |
| Icp | I [mA] | I*100 [mA] |
| Cext | — | 4.7 [nF] |
| R71 | 100 [kohm] | |
| SW72 | OFF | ON |
| C73 | 50 [pF] | |
| R74 | 100 [kohm] | |
| R75 | 2.04 [kohm] | |
| SW76 | OFF | ON |
| SW77 | OFF | ON |
| C78 | 50 [pF] | |
| SW79 | OFF | ON |
| C80 | 1 [pF] | |
| C81 | 1 [pF] | |
| R82 | 2 [kohm] | |

FIG. 26A

| PARAMETER | SETTING EXAMPLE | |
|---|---|---|
| | OPERATION MODE M1 | OPERATION MODE M2 |
| Icp | I [mA] | I*100 [mA] |
| R1 | 100 [kohm] | 2 [kohm] |
| R2 | 100 [kohm] | 2 [kohm] |
| C0 | 1 [pF] | 51 [pF] |
| C1 | 100 [pF] | 4.7 [nF] |
| C2 | 1 [pF] | 51 [pF] |

FIG. 26B

PHASE LOCKED LOOP CIRCUIT, PHASE LOCKED LOOP MODULE, AND PHASE LOCKED LOOP METHOD

CROSS REFERENCES TO RELATED APPLICATIONS

The present application claims priority to Japanese Priority Patent Application JP 2013-186043 filed in the Japan Patent Office on Sep. 9, 2013, the entire content of which is hereby incorporated by reference.

BACKGROUND

The present disclosure relates to a phase locked loop circuit that synchronizes a phase, a phase locked loop module having such a phase locked loop circuit, and a phase locked loop method used for such a phase locked loop circuit.

For example, a phase locked loop (PLL) circuit may be configured of a phase comparison circuit, a loop filter, an oscillation circuit, and a frequency divider circuit. In this configuration, for example, the phase comparison circuit may detect a phase difference between a first clock signal supplied from outside and a second clock signal supplied from the frequency divider circuit, and may supply a signal based on the phase difference to the loop filter. The loop filter filters the signal supplied from the phase comparison circuit, the oscillation circuit generates a third clock signal having a frequency corresponding to the filtered signal (for example, voltage), and the frequency divider circuit divides a frequency of the third clock signal, and generates the second clock signal having a frequency being 1/N of the frequency of the third clock signal. In such operation, when a phase of the second clock signal is delayed from a phase of the first clock signal, the phase locked loop circuit controls the phase of the second clock signal to be advanced. When the phase of the second clock signal is advanced from a phase of the first clock signal, the phase locked loop circuit controls the phase of the second clock signal to be delayed. Through such a negative feedback operation, the phase locked loop circuit synchronizes the first clock signal with the second clock signal to generate the third clock signal having a frequency N times higher than the frequency of the first clock signal.

For example, the loop filter may be used for determining response characteristics of the phase locked loop circuit, securing stability, and reducing phase noise. Specifically, it is possible to alter the characteristics of the phase locked loop circuit by altering a filter coefficient of the loop filter. For example, Japanese Unexamined Patent Application Publication No. H10-178343 discloses a phase locked loop circuit having a plurality of loop filters, which is configured to be variable in its characteristics through selection of one of the plurality of loop filters.

SUMMARY

When an electronic circuit is configured in a form of a large-scale integrated circuit (LSI), chip area is in general desired to be decreased. Hence, even if a loop filter is configured to have a variable filter coefficient, smaller chip area is also expected.

It is desirable to provide a phase locked loop circuit, a phase locked loop module, and a phase locked loop method capable of decreasing chip area while a loop filter is configured to have a variable filter coefficient.

According to an embodiment of the present disclosure, there is provided a phase locked loop circuit, including: a phase comparison section; a loop filter; and a clock signal generation section. The phase comparison section is configured to compare a phase of a first clock signal and a phase of a second clock signal. The loop filter is configured to generate a control voltage based on a comparison result by the phase comparison section. The clock signal generation section is configured to generate a clock signal having a frequency corresponding to the control voltage, and output the clock signal as the second clock signal. The loop filter includes a first resistor inserted between a first node on a signal path and a second node, a first capacitor inserted between the second node and a first DC power supply, a first switch inserted between the second node and a third node on the signal path, and a second capacitor inserted between the third node and a second DC power supply.

According to an embodiment of the present disclosure, there is provided a phase locked loop module, including: a phase locked loop circuit; and one or more individual components to be connected to the phase locked loop circuit. The phase locked loop circuit includes a phase comparison section, a loop filter, and a clock signal generation section. The phase comparison section is configured to compare a phase of a first clock signal and a phase of a second clock signal. The loop filter is configured to generate a control voltage based on a comparison result by the phase comparison section. The clock signal generation section is configured to generate a clock signal having a frequency corresponding to the control voltage, and output the clock signal as the second clock signal. The loop filter includes a first resistor inserted between a first node on a signal path and a second node, a first capacitor inserted between a second node and a first DC power supply, a first switch inserted between the second node and a third node on the signal path, and a second capacitor inserted between the third node and a second DC power supply.

According to an embodiment of the present disclosure, there is provided a phase locked loop method, including: comparing a phase of a first clock signal and a phase of a second clock signal, and supplying a result of the comparison to a loop filter, the loop filter including a first resistor inserted between a first node on a signal path and a second node, a first capacitor inserted between the second node and a first DC power supply, a first switch inserted between the second node and a third node on the signal path, and a second capacitor inserted between the third node and a second DC power supply; controlling the first switch to be on or off to generate a control voltage; and generating a clock signal having a frequency corresponding to the control voltage, and outputting the clock signal as the second clock signal.

In the phase locked loop circuit, the phase locked loop module, and the phase locked loop method according to the above-described respective embodiments of the present disclosure, the phase of the first clock signal is compared to the phase of the second clock signal, the control voltage is generated by the loop filter based on the comparison result, and the clock signal having a frequency corresponding to the control voltage is generated and outputted as the second clock signal. During this operation, in the loop filter, the first switch inserted between the second node and the third node on the signal path is set to be on or off.

According to the phase locked loop circuit, the phase locked loop module, and the phase locked loop method of the above-described respective embodiments of the present disclosure, since the first switch inserted between the second node and the third node on the signal path is provided, it is possible to decrease chip area while a loop filter is configured to have a variable filter coefficient. It is to be noted that the effects described herein are not necessarily limitative, and any of other effects described in this disclosure may be shown.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 22A is a Table illustrating a setting example of the loop filter illustrated in FIG. 20.

FIG. 22B is another Table illustrating the setting example of the loop filter illustrated in FIG. 20.

FIG. 26A is a Table illustrating a setting example of the loop filter illustrated in FIG. 24.

FIG. 26B is another Table illustrating the setting example of the loop filter illustrated in FIG. 24.

DETAILED DESCRIPTION

Hereinafter, some embodiments of the present disclosure will be described in detail with reference to the accompanying drawings. It is to be noted that description is made in the following order.

1. First embodiment.
2. Second embodiment.
3. Third embodiment.
4. Application examples.

1. First Embodiment

Exemplary Configuration

Figure 1:
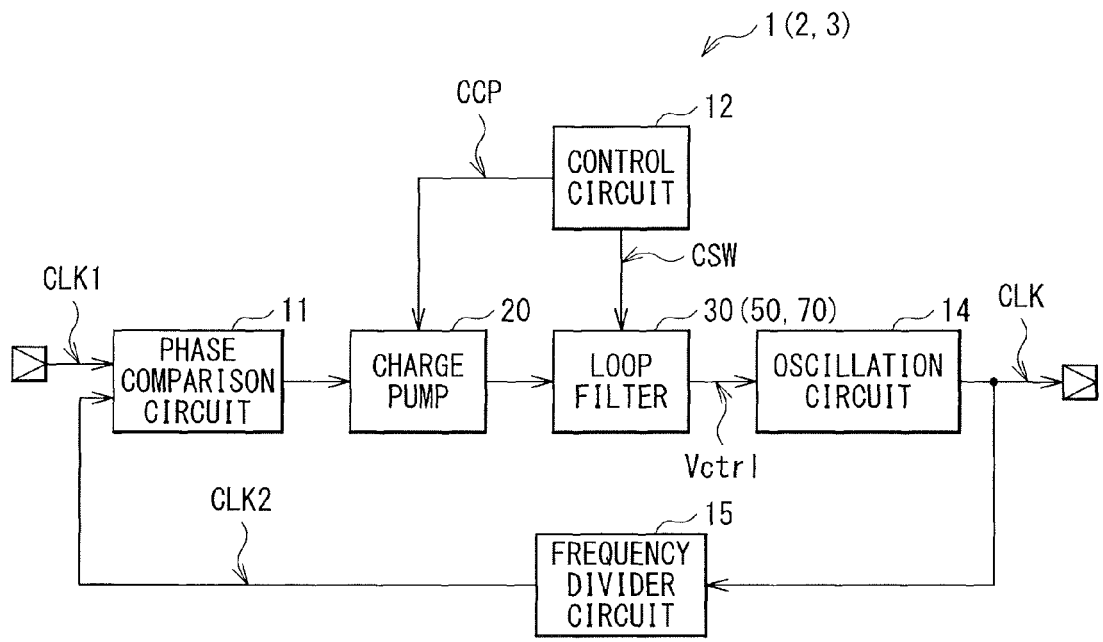
FIG. 1 is a block diagram illustrating an exemplary configuration of a phase locked loop circuit according to an embodiment of the present disclosure.

FIG. 1 illustrates an exemplary configuration of a phase locked loop circuit according to a first embodiment. The phase locked loop circuit 1 is a so-called charge pump PLL. It is to be noted that since a phase locked loop module and a phase locked loop method according to respective example embodiments of the disclosure are embodied by this embodiment, they are described together.

The phase locked loop circuit 1 receives a clock signal CLK1 and generates a clock signal CLK having a frequency N times larger than the frequency of the clock signal CLK1 based on the clock signal CLK1, and outputs the clock signal CLK. The phase locked loop circuit 1 is provided on one chip except for external components described later. The phase locked loop circuit 1 includes a phase comparison circuit 11, a control circuit 12, a charge pump 20, a loop filter 30, an oscillation circuit 14, and a frequency divider circuit 15.

The phase comparison circuit 11 compares a phase of the clock signal CLK1 with a clock signal CLK2 (described later) supplied from the frequency divider circuit 15 and outputs a result of the comparison. For example, a so-called a phase frequency detector (PFD) may be used as the phase comparison circuit 11.

The control circuit 12 sets an operation mode of the phase locked loop circuit 1. The phase locked loop circuit 1 has two operation modes M1 and M2. The operation mode M1 is a mode of operation without providing external components, and the operation mode M2 is a mode where a capacitor Cext is used as an external component to allow phase noise of the clock signal CLK to be reduced. The control circuit 12 transmits the operation mode of the phase locked loop circuit 1 to the charge pump 20 through a control signal CCP and to the loop filter 30 through a control signal CSW.

The charge pump 20 operates based on the comparison result by the phase comparison circuit 11 and on the control signal CCP so as to allow the current Icp to flow into the loop filter 30, or so as to sink the current Icp from the loop filter 30.

The loop filter 30 operates based on the control signal CSW so as to convert the current signal supplied from the charge pump 20 into a voltage signal while filtering the current signal to generate a voltage Vctrl.

Figure 2:
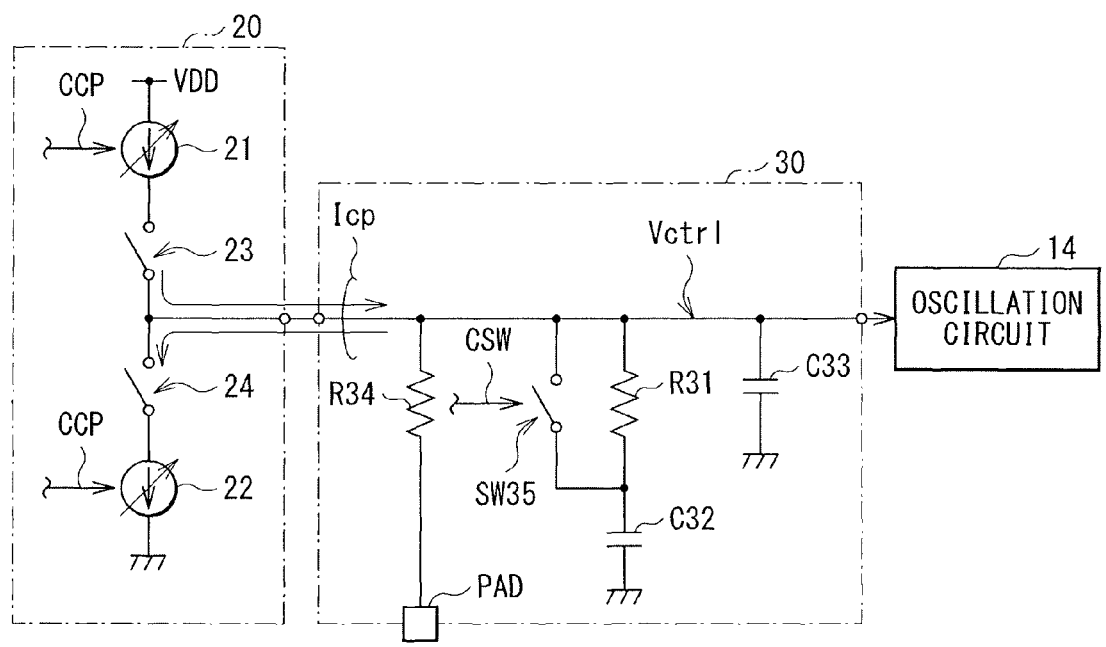
FIG. 2 is a circuit diagram illustrating an exemplary configuration of each of a charge pump and a loop filter illustrated in FIG. 1.

FIG. 2 illustrates an exemplary configuration of each of the charge pump 20 and the loop filter 30.

The charge pump 20 includes two current sources 21 and 22, and two switches 23 and 24. The current source 21 generates the current Icp that is allowed to flow into the loop filter 30, and has a first end to which a power voltage VDD is supplied, and a second end connected to a first end of the switch 23. The current source 22 generates the current Icp to be sunk from the loop filter 30, and has a first end being grounded, and a second end connected to a first end of the switch 24. Such current sources 21 and 22 are each capable of altering the quantity of the current Icp based on the control signal CCP supplied from the control circuit 12. Specifically, the current sources 21 and 22 each increase the quantity of the current Icp in the case of the operation mode M2 compared with the case of the operation mode M1. The switch 23 is turned on or off in accordance with the phase comparison result by the phase comparison circuit 11, and has the first end connected to the second end of the current source 21, and a second end connected to a second end of the switch 24 and the loop filter 30. The switch 24 is turned on or off in accordance with the phase comparison result by the phase comparison circuit 11, and has the first end connected to the second end of the current source 22, and the second end connected to the second end of the switch 23 and the loop filter 30.

According to such a configuration, in the charge pump 20, the switches 23 and 24 are each selectively turned on or off for a period of duration corresponding to a phase difference caused by advance or delay of the phase of each of the clock signals CLK1 and CLK2. When the switch 23 is turned on, the current source 21 allows the current Icp to flow into the loop filter 30. When the switch 24 is turned on, the current source 22 sinks the current Icp from the loop filter 30. Consequently, the charge pump 20 is allowed to supply a pulse current having a pulse width and a polarity corresponding to advance or delay of the phase of each of the clock signals CLK1 and CLK2.

The loop filter 30 includes resistors R31 and R34, capacitors C32 and C33, and a switch SW35. The resistor R31 has a first end connected to a first end of the capacitor C33, a first end of the resistor R34, a first end of the switch SW35, an output terminal of the charge pump 20, and an input terminal of the oscillation circuit 14, and has a second end connected to a first end of the capacitor C32 and a second end of the switch SW35. The capacitor C32 has the first end connected to the second end of the resistor R31 and the second end of the switch SW35, and has a second end being grounded. The capacitor C33 has the first end connected to the first end of each of the resistors R31 and R34, the first end of the switch SW35, the output terminal of the charge pump 20, and the input terminal of the oscillation circuit 14, and has a second end being grounded. The resistor R34 has the first end connected to the first end of the resistor R31, the first end of the capacitor C33, the first end of the switch SW35, the output terminal of the charge pump 20, and the input terminal of the oscillation circuit 14, and has a second end connected to a pad PAD of a chip on which the phase locked loop circuit 1 is provided. In other words, in the operation mode M2, the second end of the resistor R34 is allowed to be connected to the capacitor Cext as an external component via the pad PAD. The switch SW35 is turned on or off based on the control signal CSW supplied from the control circuit 12, and has the first end connected to the first end of each of the resistors R31 and R34 and the first end of the capacitor C33, and has the second end connected to the second end of the resistor R31 and the first end of the capacitor C32. The switch SW35 is off in the operation mode M1 while being on in the operation mode M2.

According to such a configuration, the loop filter 30 alters a filter coefficient depending on the operation mode M1 or M2. Specifically, as described later, the switch SW35 is controlled to be off in the operation mode M1. In this case, no external component is connected to the pad PAD. In the operation mode M2, the switch SW35 is controlled to be on, and the capacitor Cext as the external component is connected to the pad PAD. At this time, as described later, the loop filter 30 is configured to be representable using the same equivalent circuit configuration (topology) in each of the operation modes M1 and M2.

The loop filter 30 converts the current signal supplied from the charge pump 20 into a voltage signal with the transimpedance Zlpf(s) of the loop filter 30 to generate a voltage Vctrl. At this time, as described later, the loop filter 30 decreases the transimpedance Zlpf(s) in the case of the operation mode M2 than in the case of the operation mode M1.

The oscillation circuit 14 is a voltage controlled oscillator (VCO) circuit, and generates, based on the voltage Vctrl, a clock signal CLK having a frequency corresponding to the voltage Vctrl. A relationship between the frequency of the clock signal CLK and the voltage Vctrl is represented by a gain factor Kvco [Hz/V]. Specifically, when the voltage is varied by 1 V, the frequency of the clock signal CLK is varied by Kvco.

The frequency divider circuit 15 divides the frequency of the clock signal CLK into 1/N thereof to generate the clock signal CLK2. N is an integer of 2 or more. It is to be noted that this is not limitative, and N may be a non-integer of more than 1, or the frequency divider circuit 15 may not be provided. In a possible exemplary case where N is a non-integer of more than 1, for example, 10 frequency division and 11 frequency division may be alternately repeated so that 10.5 frequency division is averagely given.

According to such a configuration, when a phase of the clock signal CLK2 is delayed from a phase of the clock signal CLK1, the phase locked loop circuit 1 increases the frequency of the clock signal CLK so as to control the phase of the clock signal CLK2 to be advanced. When the phase of the clock signal CLK2 is advanced from the phase of the clock signal CLK1, the phase locked loop circuit 1 decreases the frequency of the clock signal CLK so as to control the phase of the clock signal CLK2 to be delayed. Through such a negative feedback operation, the phase locked loop circuit 1 synchronizes the clock signal CLK1 with the clock signal CLK2 to generate the clock signal CLK having a frequency N times larger than the frequency of the clock signal CLK1. The closed-loop transfer function CL(s) of the phase locked loop circuit 1 is represented as follows.

$$CL(s) \equiv \frac{\phi_{out}}{\phi_{in}} = \frac{\frac{I_{cp}}{2\pi} \cdot Z_{lpf}(s) \cdot \frac{K_{VCO}}{s}}{s + \frac{I_{cp}}{2\pi} \cdot Z_{lpf}(s) \cdot \frac{K_{VCO}}{s} \cdot \frac{1}{N}}$$

where φin denotes the phase of the clock signal CLK1, and φout denotes the phase of the clock signal CLK. The response characteristics and stability of the loop of the phase locked loop circuit 1 are represented by this closed-loop transfer function CL(s).

At this time, as described above, the current sources 21 and 22 each increase the current Icp in the case of the operation mode M2 compared with the case of the operation mode M1, and the loop filter 30 decreases the transimpedance Zlpf in the operation mode M2 compared with the case of the operation mode M1. Consequently, in the phase locked loop circuit 1, the product (Icp×Zlpf(s)) of the current Icp and the transimpedance Zlpf(s) in the operation mode M1 is substantially equal to that in the operation mode M2. Consequently, in the phase locked loop circuit 1, while substantially the same response characteristics and stability are achieved between the operation modes M1 and M2, it is possible to omit the external component (the capacitor Cext) in the operation mode M1 and to reduce the phase noise in the operation mode M2.

The clock signal CLK1 corresponds to a specific but not limitative example of "first clock signal" in one embodiment of the disclosure. The clock signal CLK2 corresponds to a specific but not limitative example of "second clock signal" in one embodiment of the disclosure. The phase comparison circuit 11 and the charge pump 20 collectively correspond to a specific but not limitative example of "phase comparison section" in one embodiment of the disclosure. The oscillation circuit 14 and the frequency divider circuit 15 collectively correspond to a specific but not limitative example of "clock generation section" in one embodiment of the disclosure. The resistor R31 corresponds to a specific but not limitative example of "first resistor" in one embodiment of the disclosure. The capacitor C32 corresponds to a specific but not limitative example of "first capacitor" in one embodiment of the disclosure. The switch SW35 corresponds to a specific but not limitative example of "first switch" in one embodiment of the disclosure. The capacitor C33 corresponds to a specific but not limitative example of "second capacitor" in one embodiment of the disclosure.

[Operation and Functions]

Operation and functions of the phase locked loop circuit 1 of the first embodiment are now described.

(Summary of Overall Operation)

First, summary of overall operation of the phase locked loop circuit 1 is described with reference to FIG. 1. The phase comparison circuit 11 compares a phase of the clock signal CLK1 with a phase of the clock signal CLK2, and outputs a result of the comparison. The control circuit 12 sets an operation mode of the phase locked loop circuit 1, and transmits the operation mode to the charge pump 20 through the control signal CCP and to the loop filter 30 through the control signal CSW. The charge pump 20 operates based on the comparison result by the phase comparison circuit 11 and on the control signal CCP so as to allow the current Icp to flow into the loop filter 30, or so as to sink the current Icp from the loop filter 30. The loop filter 30 operates based on the control signal CSW so as to convert the current signal supplied from the charge pump 20 into a voltage signal while filtering the current signal to generate the voltage Vctrl. The oscillation circuit 14 operates based on the voltage Vctrl so as to generate the clock signal CLK having a frequency corresponding to the voltage Vctrl. The frequency divider circuit 15 divides the frequency of the clock signal CLK into 1/N thereof to generate the clock signal CLK2.

(Detailed Operation)

The phase locked loop circuit 1 alters the filter coefficient of the loop filter 30, and alters the current Icp of the charge pump 20 depending on the operation mode M1 or M2. The operation of the phase locked loop circuit 1 in each of the operation modes M1 and M2 is described in detail below.

Figure 3A:
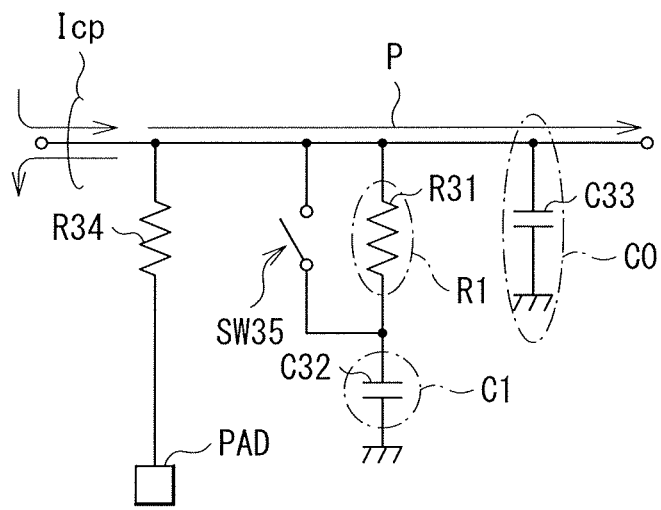
FIG. 3A is an explanatory diagram illustrating an exemplary operation of the loop filter illustrated in FIG. 1.
Figure 3B:
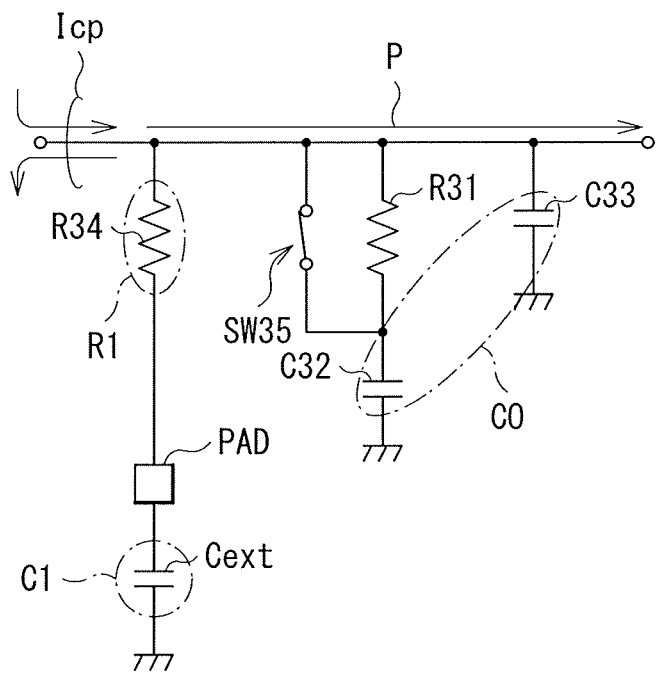
FIG. 3B is an explanatory diagram illustrating another exemplary operation of the loop filter illustrated in FIG. 1.

FIG. 3A illustrates an exemplary configuration of the loop filter 30 in the operation mode M1. FIG. 3B illustrates an exemplary configuration of the loop filter 30 in the operation mode M2. FIGS. 3A and 3B each illustrate an on or off state of the switch SW35. In the operation mode M1, as illustrated in FIG. 3A, the switch SW35 is off, and no external component is connected to the pad PAD. On the other hand, in the operation mode M2, as illustrated in FIG. 3B, the switch SW35 is on, and the capacitor Cext as the external component is connected to the pad PAD. Hence, the same signal path P is provided regardless of the operation mode M1 or M2.

It is possible to represent the loop filter 30 by the same equivalent circuit configuration (topology) in each of the operation modes M1 and M2. The equivalent circuit is described below.

Figures 4, 5A, 5B:
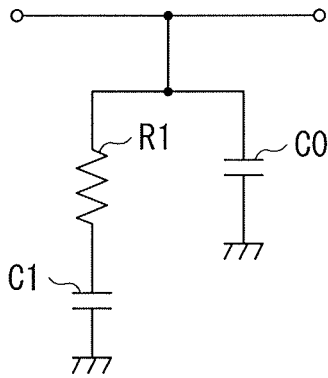
FIG. 4 is a circuit diagram illustrating an equivalent circuit of the loop filter illustrated in FIG. 1.
FIG. 5A is a Table illustrating a setting example of the loop filter illustrated in FIG. 1.
FIG. 5B is another Table illustrating the setting example of the loop filter illustrated in FIG. 1.

FIG. 4 illustrates the equivalent circuit of the loop filter 30. It is possible to represent the loop filter 30 by an equivalent resistance R1 and equivalent capacitances C0 and C1. The equivalent resistance R1 has a first end connected to a first end of the equivalent capacitance C0, and has a second end connected to a first end of the equivalent capacitance C1. The equivalent capacitance C0 has the first end connected to the first end of the equivalent resistance R1, and a second end being grounded. The equivalent capacitance C1 has the first end connected to the second end of the equivalent resistance R1, and a second end being grounded.

In the operation mode M1, as illustrated in FIG. 3A, the resistor R31 corresponds to the equivalent resistance R1, the capacitor C33 corresponds to the equivalent capacitance C0, and the capacitor C32 corresponds to the equivalent capacitance C1. Since no external component is connected to the pad PAD, the resistor R34 is electrically negligible.

On the other hand, in the operation mode M2, as illustrated in FIG. 3B, the resistor R34 corresponds to the equivalent resistance R1, the capacitors C32 and C33 collectively correspond to the equivalent capacitance C0, and the capacitor Cext corresponds to the equivalent capacitance C1. Since the switch SW35 is on, the resistor R31 is electrically negligible.

In this way, the loop filter 30 is represented by the equivalent circuit illustrated in FIG. 4 in each of the operation modes M1 and M2. The transimpedance Zlpf(s) of the equivalent circuit is represented as follows.

$$Z_{1pf}(s) \equiv \frac{1}{s(C0+C1)} \cdot \frac{1+s \cdot C1 \cdot R1}{1+s\frac{C0 \cdot C1}{C0+C1}R1}$$

This transimpedance Zlpf(s) has two poles and one zero. In other words, the phase locked loop circuit 1 using the loop filter 30 is a secondary phase locked loop circuit.

FIG. 5A illustrates a specific setting example of each of the charge pump 20 and the loop filter 30. FIG. 5B illustrates a value of the equivalent resistance R1 and values of the equivalent capacitances C0 and C1 in the setting as illustrated in FIG. 5A.

In the charge pump 20, as illustrated in FIGS. 5A and 5B, a value of the current Icp is set to I [mA] in the operation mode M1, and set to I×100 [mA] in the operation mode M2. In other words, it is possible to adjust the value of the current Icp in the operation mode M2 to be 100 times larger than the value thereof in the case of the operation mode M1.

In the loop filter 30, as illustrated in FIG. 5A, the resistance value of the resistor R31 is set to 100 [kohm], and the resistance value of the resistor R34 is set to 1 [kohm]. Consequently, as illustrated in FIG. 5B, it is possible to adjust the value of the equivalent resistance R1 to be 100 [kohm] in the operation mode M1, and to be 1 [kohm] in the operation mode M2. In other words, it is possible to adjust the value of the equivalent resistance R1 in the operation mode M2 to be 1/100 of the value thereof in the case of the operation mode M1.

Furthermore, in the loop filter 30, as illustrated in FIG. 5A, the capacitance value of the capacitor C32 is set to 100 [pF], and the capacitance value of the capacitor C33 is set to 1 [pF]. Consequently, as illustrated in FIG. 5B, it is possible to adjust the value of the equivalent capacitance C0 to be 1 [pF] in the operation mode M1, and to be 101 [pF] in the operation mode M2. In other words, it is possible to adjust the value of the equivalent capacitance C0 in the operation mode M2 to be about 100 times larger than the value thereof in the case of the operation mode M1.

Furthermore, in the loop filter 30, as illustrated in FIG. 5A, the capacitance value of the capacitor C32 is set to 100 [pF], and the capacitance value of the capacitor Cext is set to 10 [nF]. Consequently, as illustrated in FIG. 5B, it is possible to adjust the value of the equivalent capacitance C1 to be 100 [pF] in the operation mode M1, and to be 10 [nF] in the operation mode M2. In other words, it is possible to adjust the value of the equivalent capacitance C1 in the operation mode M2 to be 100 times larger than the value thereof in the case of the operation mode M1. Since such a capacitance value of 10 [nF] is in general too large to be provided in LSI, the capacitor Cext as the external component is used. Using the external component in this way makes it possible to increase the value of the equivalent capacitance C1 in the operation mode M2.

In this way, the value of the equivalent resistance R1 in the operation mode M2 is 1/100 of the value thereof in the case of the operation mode M1. The value of each of the equivalent capacitances C0 and C1 in the operation mode M2 is about 100 times larger than the value thereof in the case of the operation mode M1. Consequently, the transimpedance Zlpf(s) (numerical expression (2)) of the loop filter 30 in the operation mode M2 is about 1/100 of that in the case of the operation mode M1. On the other hand, the value of the current Icp in the operation mode M2 is 100 times larger than the value thereof in the case of the operation mode M1. Hence, substantially the same closed-loop transfer function CL(s) (numerical expression (1)) is given regardless of the operation mode M1 or M2. This is because, as shown in numerical expression (1), the current Icp and the transimpedance Zlpf(s) are inserted in a form of the product (Icp×Zlpf(s)) of them in each of the denominator and the numerator of the closed-loop transfer function CL(s), and such products are substantially the same between the operation modes M1 and M2. In this way, since substantially the same closed-loop transfer function CL(s) is given regardless of the operation mode M1 or M2, the phase locked loop circuit 1 achieves substantially the same response characteristics and stability between the operation modes M1 and M2.

Furthermore, in the phase locked loop circuit 1, as illustrated in FIG. 5B, since the capacitor Cext as the external component is used in the operation mode M2, a large capacitance value is achieved, and therefore the phase noise is allowed to be reduced. Specifically, the capacitor Cext having a large capacitance value is used in the operation mode M2, thereby the value of the equivalent capacitance C1 in the operation mode M2 is adjusted to be 100 times larger than the value thereof in the case of the operation mode M1. In the phase locked loop circuit 1, since substantially the same closed-loop transfer function CL(s) (numerical expression (1)) is given regardless of the operation mode M1 or M2, increasing the value of the equivalent capacitance C1 in the operation mode M2 in this way makes it possible to decrease the equivalent resistance R1. Hence, it is possible to reduce thermal noise Vn generated in the equivalent resistance R1, and therefore the phase noise is allowed to be reduced. Specifically, a resistor in general generates thermal noise Vn corresponding to a resistance value thereof. Such thermal noise Vn is represented by the following numerical expression.

$$Vn = \sqrt{4kTR}$$

where k is Boltzmann constant, T is temperature, and R is a resistance value of the resistor. The thermal noise Vn generated in the equivalent resistance R1 of the loop filter 30 is superimposed on the voltage Vctrl, and the oscillation circuit 14 generates the clock signal CLK based on the voltage Vctrl on which the thermal noise Vn is superimposed. In other words, the phase noise of the clock signal CLK is smaller as the thermal noise Vn is lower. In the phase locked loop circuit 1, since the capacitor Cext as the external component is used in the operation mode M2, it is possible to reduce the resistance value of the equivalent resistance R1 and thus reduce the thermal noise Vn. Hence, it is possible to control the phase noise to be low.

Furthermore, as illustrated in FIG. 5A, since the phase locked loop circuit 1 is allowed to operate without the capacitor Cext as the external component in the operation mode M1, it is possible to achieve reduction in the number of components, facilitation of a substrate layout, cost reduction, and the like, for example, in an application in which the phase noise is not significantly disadvantageous.

Furthermore, in the phase locked loop circuit 1, the switch SW35 is connected to the first end of the capacitor C32 to switch the role of the capacitor C32 between the operation modes M1 and M2. It is therefore possible to effectively use area of the chip on which the phase locked loop circuit 1 is formed. Specifically, since large area is necessary to achieve a capacitor having a large capacitance, the capacitor C32 inevitably has a large area. Hence, if the capacitor C32 is used only in the operation mode M1 while being not used in the operation mode M2, a substantially unused portion is formed on a chip, so that area of the chip is not effectively used. In contrast, in the phase locked loop circuit 1, the role of the capacitor C32 is switched between the operation modes M1 and M2. Specifically, the capacitor C32 configures the equivalent capacitance C1 in the operation mode M1 (FIG. 3A) while configuring the equivalent capacitance C0 together with the capacitor C33 in the operation mode M2 (FIG. 3B). In this way, in the phase locked loop circuit 1, the role of the capacitor C32 is switched between the operation modes M1 and M2. Hence, the capacitor C32 is usable in each of the operation modes M1 and M2, and therefore chip area is allowed to be effectively used.

Furthermore, in the phase locked loop circuit 1, the first end of the capacitor C33 is connected to the signal path P in each of the operation modes M1 and M2. Specifically, the capacitor C33 singly configures the equivalent capacitance C0 in the operation mode M1 (FIG. 3A), and configures the equivalent capacitance C0 together with the capacitor C32 in the operation mode M2 (FIG. 3B). In this way, in the phase locked loop circuit 1, since the capacitor C33 is usable in each of the operation modes M1 and M2, chip area is allowed to be effectively used.

Furthermore, in the phase locked loop circuit 1, since one switch SW35 is used to switch between the operation modes M1 and M2 in the loop filter 30, it is possible to suppress degradation of the characteristics of the phase locked loop circuit 1. Specifically, the switch may in general cause current leakage. Hence, for example, when the loop filter 30 is configured such that a plurality of switches are used to switch between the operation modes M1 and M2, current leakage may occur along a path in which each switch is inserted, and the characteristics of the phase locked loop circuit 1 may be degraded. In contrast, in the phase locked loop circuit 1, since one switch SW35 is used to switch between the operation modes M1 and M2, it is possible to suppress degradation of the characteristics due to current leakage.

The functions of the first embodiment are now described in comparison with several comparative examples.

Comparative Example 1

In comparative example 1, one phase locked loop circuit is not shared for two applications, and phase locked loop circuits are separately prepared for respective applications. Specifically, in the comparative example 1, for example, there may be prepared a phase locked loop circuit 1R (corresponding to the operation mode M1 in the first embodiment) that is operable without providing any external component, and a phase locked loop circuit 1S (corresponding to the operation mode M2 in the first embodiment) capable of decreasing the phase noise.

Figure 6A:
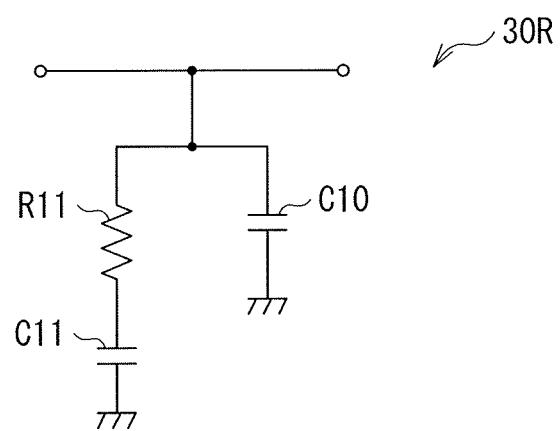
FIG. 6A is a circuit diagram illustrating an exemplary configuration of a loop filter according to a comparative example.
Figure 6B:
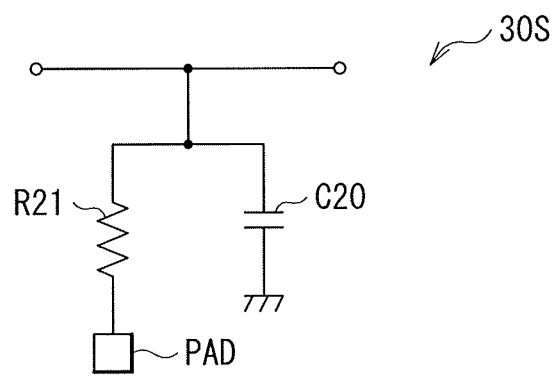
FIG. 6B is another circuit diagram illustrating an exemplary configuration of the loop filter according to the comparative example.

FIG. 6A illustrates an exemplary configuration of a loop filter 30R of the phase locked loop circuit 1R. FIG. 6B illustrates an exemplary configuration of a loop filter 30S of the phase locked loop circuit 1S.

The loop filter 30R includes a resistor R11 and capacitors C10 and C11. The resistor R11 has a first end connected to a first end of the capacitor C10, an output terminal of a charge pump 20, and an input terminal of an oscillation circuit 14, and has a second end connected to a first end of the capacitor C11. The capacitor C10 has the first end connected to the first end of the resistor R11, the output terminal of the charge pump 20, and the input terminal of the oscillation circuit 14, and has a second end being grounded. The capacitor C11 has the first end connected to the second end of the resistor R11, and has a second end being grounded. For example, the respective values of the equivalent resistance R1 and the equivalent capacitances C0 and C1 (FIG. 5B) in the operation mode M1 of the loop filter 30 according to the first embodiment may be used as the respective element values of the resistor R11 and the capacitors C10 and C11 in the loop filter 30R (FIG. 6A).

The loop filter 30S includes a resistor R21 and a capacitor C20. The resistor R21 has a first end connected to a first end of the capacitor C20, the output terminal of the charge pump 20, and the input terminal of the oscillation circuit 14, and has a second end connected to a pad PAD. The capacitor C20 has the first end connected to the first end of the resistor R21, the output terminal of the charge pump 20, and the input terminal of the oscillation circuit 14, and has a second end being grounded. For example, the respective values of the equivalent resistance R1 and the equivalent capacitance C0 (FIG. 5B) in the operation mode M2 of the loop filter 30 according to the first embodiment may be used as the respective element values of the resistor R21 and the capacitor C20 in the loop filter 30S (FIG. 6B).

In this way, when the two phase locked loop circuits 1R and 1S are separately provided, two types of chips are necessary to be manufactured. Hence, separate manufacturing masks and inspection tools are also necessary, which may lead to an increase in manufacturing cost and in inspection cost.

In contrast, in the phase locked loop circuit 1 according to the first embodiment, since the two operation modes M1 and M2 are provided in one phase locked loop circuit 1, it is possible to share one chip for two applications, allowing manufacturing cost and inspection cost to be reduced.

Comparative Example 2

In comparative example 2, one phase locked loop circuit 1T has two loop filters 30R and 30S, and one of the two loop filters 30R and 30S is selected depending on the operation mode M1 or M2.

Figure 7A:
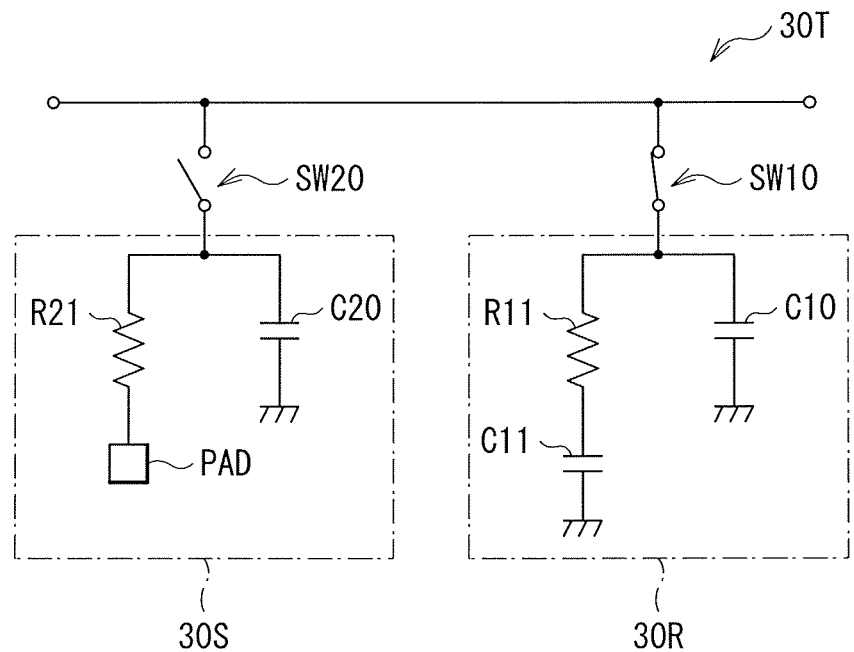
FIG. 7A is an explanatory diagram illustrating an exemplary operation of a loop filter according to another comparative example.
Figure 7B:
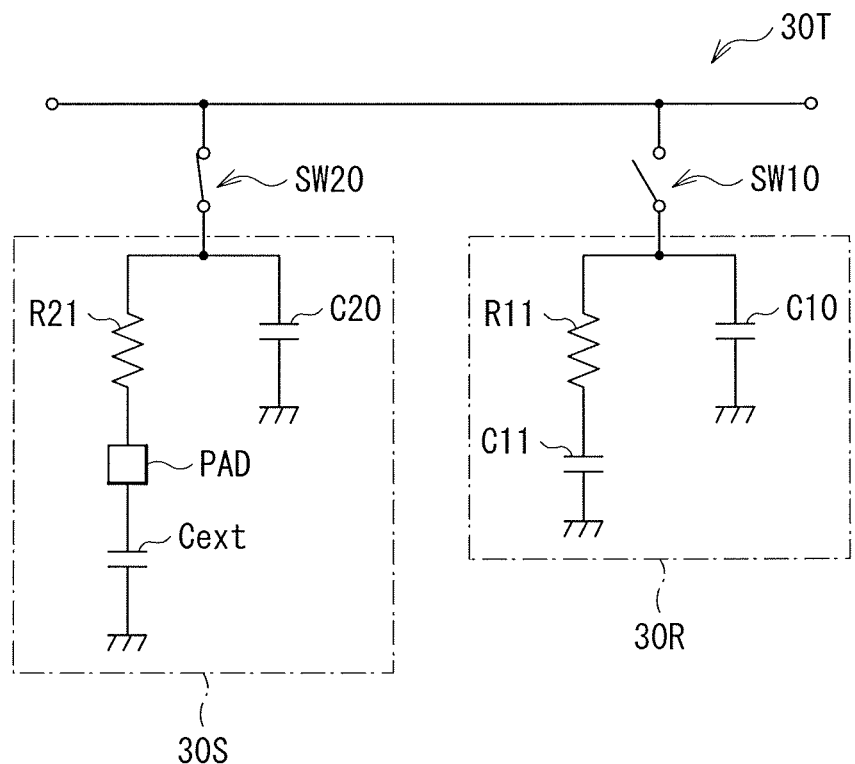
FIG. 7B is an explanatory diagram illustrating an exemplary operation of the loop filter according to the comparative example.

FIGS. 7A and 7B illustrate an exemplary configuration of a loop filter 30T according to the comparative example 2, where FIG. 7A illustrates an exemplary operation in the operation mode M1, and FIG. 7B illustrates an exemplary operation in the operation mode M2. The loop filter 30T includes a switch SW10, the loop filter 30R, a switch SW20, and the loop filter 30S. The switch SW10 has a first end connected to a first end of the switch SW20, an output terminal of a charge pump 20, and an input terminal of an oscillation circuit 14, and has a second end connected to a resistor R11 and a capacitor C10 of the loop filter 30R. The switch SW20 has the first end connected to the first end of the switch SW10, the output terminal of the charge pump 20, and the input terminal of the oscillation circuit 14, and has a second end connected to a resistor R21 and a capacitor C20 of the loop filter 30S. According to such a configuration, in the loop filter 30T, the switch SW10 is controlled to be on and the switch SW20 is controlled to be off to select the loop filter 30R in the operation mode M1 (FIG. 7A), and the switch SW20 is controlled to be on and the switch SW10 is controlled to be off to select the loop filter 30S in the operation mode M2 (FIG. 7B).

In this way, the two loop filters 30R and 30S are provided, and one of such loop filters is selectively used. In such a case, for example, since the loop filter 30R may not be used in the operation mode M2, substantially unused portion may be formed on a chip, and chip area is not allowed to be effectively used.

In contrast, in the phase locked loop circuit 1 according to the first embodiment, since the elements of the loop filter 30 are usable in each of the operation modes M1 and M2, it is possible to effectively use chip area.

[Effects]

In the first embodiment, since the two operation modes M1 and M2 are provided, it is possible to share one chip for two applications, allowing manufacturing cost and inspection cost to be reduced.

In the first embodiment, since the capacitor Cext as the external component is used in the operation mode M2, it is possible to reduce the phase noise.

In the first embodiment, since the phase locked loop circuit 1 is allowed to operate without the capacitor Cext as the external component in the operation mode M1, it is possible to achieve reduction in the number of components, facilitation of a substrate layout, cost reduction, and the like in an application in which the phase noise is not significantly disadvantageous.

In the first embodiment, since a current value of the current Icp of the charge pump is varied depending on the operation mode, it is possible to reduce a possibility of variations in response characteristics and stability depending on the operation mode.

In the first embodiment, since the switch SW35 is connected to the first end of the capacitor C32 to switch the role of the capacitor C32 between the operation modes M1 and M2, it is possible to effectively use chip area.

[Modification 1-1]

Although the secondary phase locked loop circuit is configured using the loop filter 30 in the first embodiment, this is not limitative. Alternatively, for example, a higher-order phase locked loop circuit may be configured. A tertiary phase locked loop circuit 1A and a quaternary phase locked loop circuit 1B are exemplarily described below. First, a loop filter 30A used in the tertiary phase locked loop circuit 1A is described.

Figure 8:
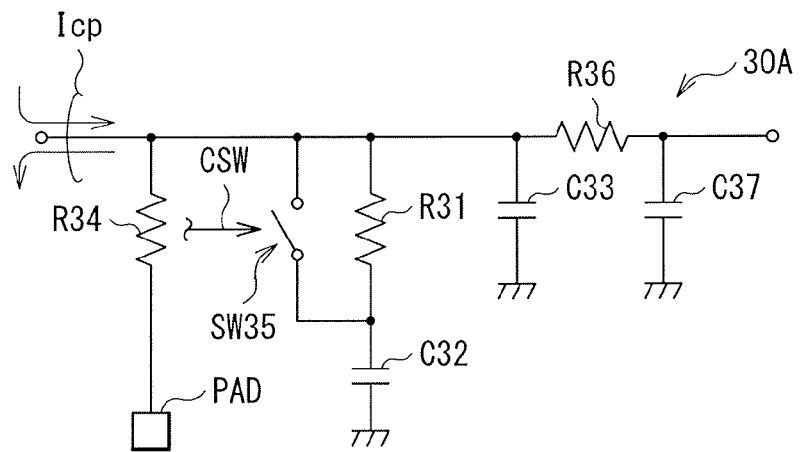
FIG. 8 is a circuit diagram illustrating an exemplary configuration of a loop filter according to a modification of the first embodiment.

FIG. 8 illustrates an exemplary configuration of the loop filter 30A. In this loop filter 30A, a primary low-pass filter configured of a resistor R36 and a capacitor C37 is added to a subsequent stage of the loop filter 30 according to the first embodiment. The resistor R36 has a first end connected to a first end of each of resistors R31 and R34, a first end of a capacitor C33, a first end of a switch SW35, and an output terminal of a charge pump 20, and has a second end connected to a first end of the capacitor C37 and an input terminal of an oscillation circuit 14. The capacitor C37 has the first end connected to the second end of the resistor R36 and the input terminal of the oscillation circuit 14, and has a second end being grounded.

The resistor R36 corresponds to a specific but not limitative example of "second resistor" in one embodiment of the disclosure. The capacitor C37 corresponds to a specific but not limitative example of "third capacitor" in one embodiment of the disclosure.

Figure 9A:
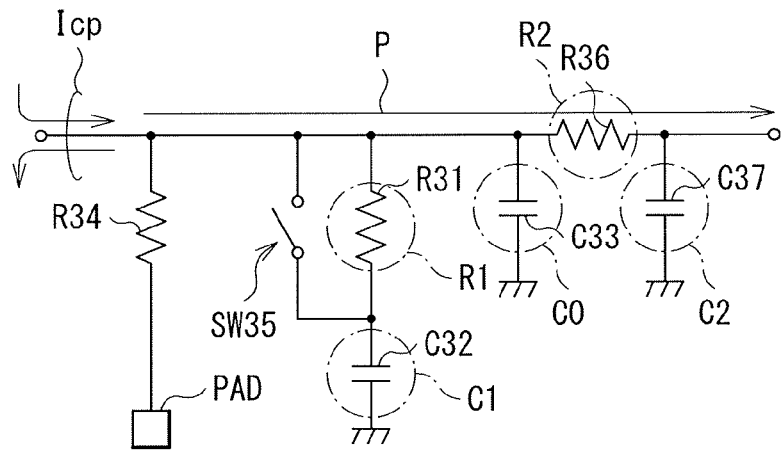
FIG. 9A is an explanatory diagram illustrating an exemplary operation of the loop filter illustrated in FIG. 8.
Figure 9B:
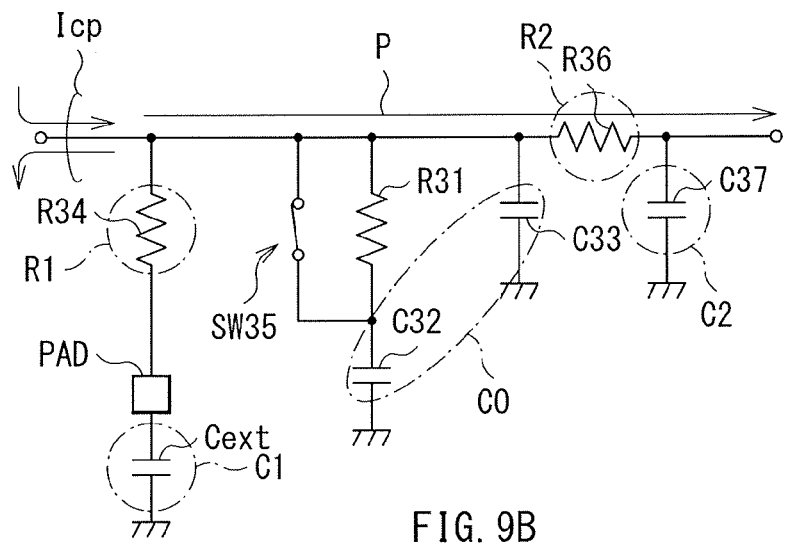
FIG. 9B is an explanatory diagram illustrating another exemplary operation of the loop filter illustrated in FIG. 8.

FIG. 9A illustrates an exemplary configuration of the loop filter 30A in the operation mode M1. FIG. 9B illustrates an exemplary configuration of the loop filter 30A in the operation mode M2. As with the first embodiment, in the operation mode M1, as illustrated in FIG. 9A, the switch SW35 is off, and no external component is connected to the pad PAD. On the other hand, in the operation mode M2, as illustrated in FIG. 9B, the switch SW35 is on, and the capacitor Cext as the external component is connected to the pad PAD.

Figures 10, 11A, 11B:
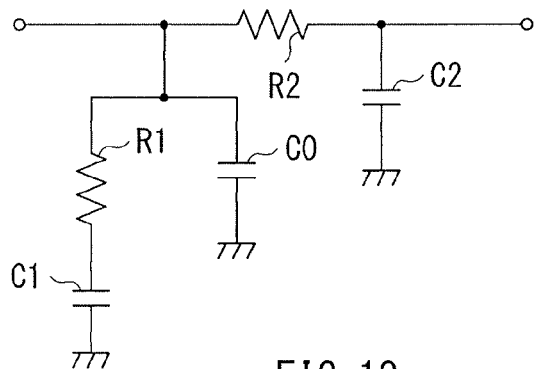
FIG. 10 is a circuit diagram illustrating an equivalent circuit of the loop filter illustrated in FIG. 8.
FIG. 11A is a Table illustrating a setting example of the loop filter illustrated in FIG. 8.
FIG. 11B is another Table illustrating the setting example of the loop filter illustrated in FIG. 8.

FIG. 10 illustrates an equivalent circuit of the loop filter 30A. In the equivalent circuit of the loop filter 30A, a primary low-pass filter configured of an equivalent resistance R2 and an equivalent capacitance C2 is added to a subsequent stage of the equivalent circuit (FIG. 4) of the loop filter 30 according to the first embodiment. In other words, the phase locked loop circuit 1A using the loop filter 30A is a tertiary phase locked loop circuit. The equivalent resistance R2 has a first end connected to a first end of each of an equivalent resistance R1 and an equivalent capacitance C0, and has a second end connected to a first end of the equivalent capacitance C2. The equivalent capacitance C2 has the first end connected to the second end of the equivalent resistance R2, and a second end being grounded.

As illustrated in FIGS. 9A and 9B, the resistor R36 corresponds to the equivalent resistance R2, and the capacitor C37 corresponds to the equivalent capacitance C2. Correspondence relationships between the resistors R31 and R34 and the equivalent resistance R1, between the capacitors C32 and C33 and the equivalent capacitance C0, and between the capacitor Cext and the equivalent capacitance C1 are similar to those in the first embodiment.

FIG. 11A illustrates a specific setting example of each of the charge pump 20 and the loop filter 30A. FIG. 11B illustrates values of the equivalent resistances R1 and R2 and values of the equivalent capacitances C0 to C2 in the setting as illustrated in FIG. 11A. This setting is similar to that in the first embodiment (FIGS. 5A and 5B) except for the resistor R36 (the equivalent resistance R2) and the capacitor C37 (the equivalent capacitance C2).

Next, a loop filter 30B used in the quaternary phase locked loop circuit 1B is described.

Figure 12:
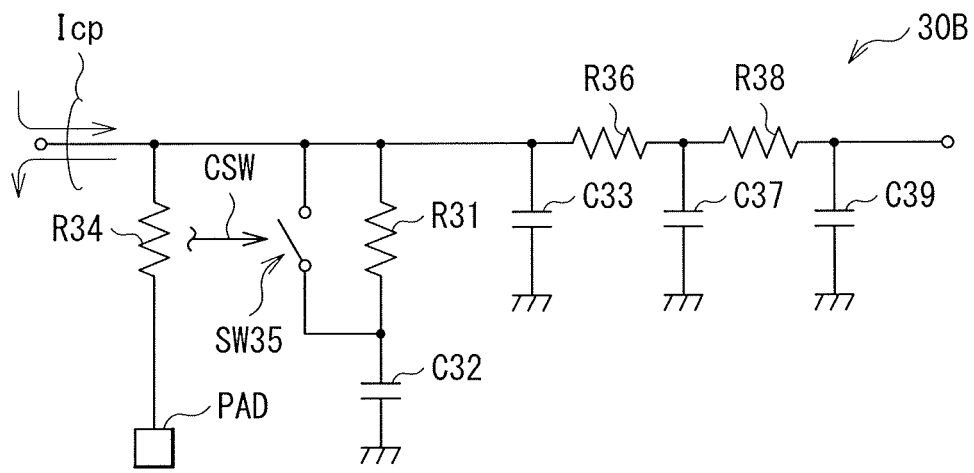
FIG. 12 is a circuit diagram illustrating an exemplary configuration of a loop filter according to another modification of the first embodiment.

FIG. 12 illustrates an exemplary configuration of the loop filter 30B. In this loop filter 30B, a primary low-pass filter configured of a resistor R38 and a capacitor C39 is added to a subsequent stage of the loop filter 30A. The resistor R38 has a first end connected to the second end of the resistor R36 and the output terminal of the charge pump 20, and has a second end connected to a first end of the capacitor C39 and the input terminal of the oscillation circuit 14. The capacitor C39 has the first end connected to the second end of the resistor R38 and the input terminal of the oscillation circuit 14, and has a second end being grounded.

Figure 13:
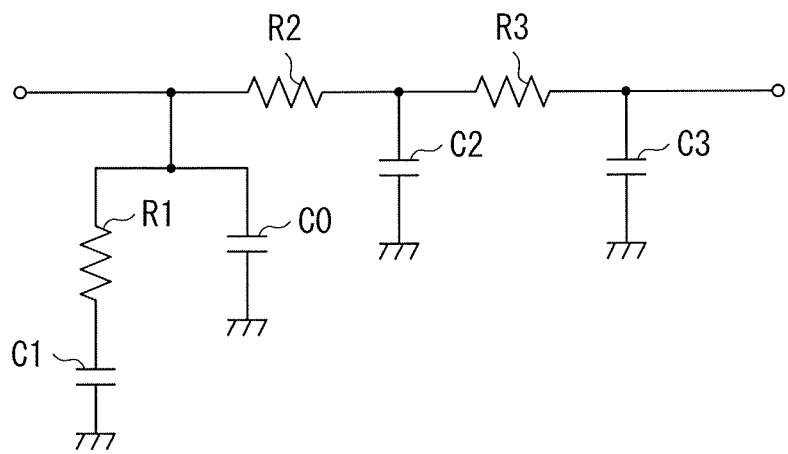
FIG. 13 is a circuit diagram illustrating an equivalent circuit of the loop filter illustrated in FIG. 12.

FIG. 13 illustrates an equivalent circuit of the loop filter 30B. In the equivalent circuit of the loop filter 30B, a primary low-pass filter configured of an equivalent resistance R3 and an equivalent capacitance C3 is added to a subsequent stage of the equivalent circuit (FIG. 10) of the loop filter 30A. In other words, the phase locked loop circuit 1B using the loop filter 30B is a quaternary phase locked loop circuit. The equivalent resistance R3 has a first end connected to the second end of the equivalent resistance R2 and the first end of the equivalent capacitance C2, and has a second end connected to a first end of the equivalent capacitance C3. The equivalent capacitance C3 has the first end connected to the second end of the equivalent resistance R3, and a second end being grounded.

In the case where the high-order phase locked loop circuit is configured using the loop filter 30A or 30B in this way, it is also possible to provide effects similar to those in the first embodiment.

[Modification 1-2]

Although the phase locked loop circuit 1 is configured using the charge pump 20 configured to output a current in the first embodiment, this is not limitative. Alternatively, the phase locked loop circuit may be configured using a circuit configured to output a voltage. A phase locked loop circuit 1C according to Modification 1-2 is described in detail below.

Figure 14:
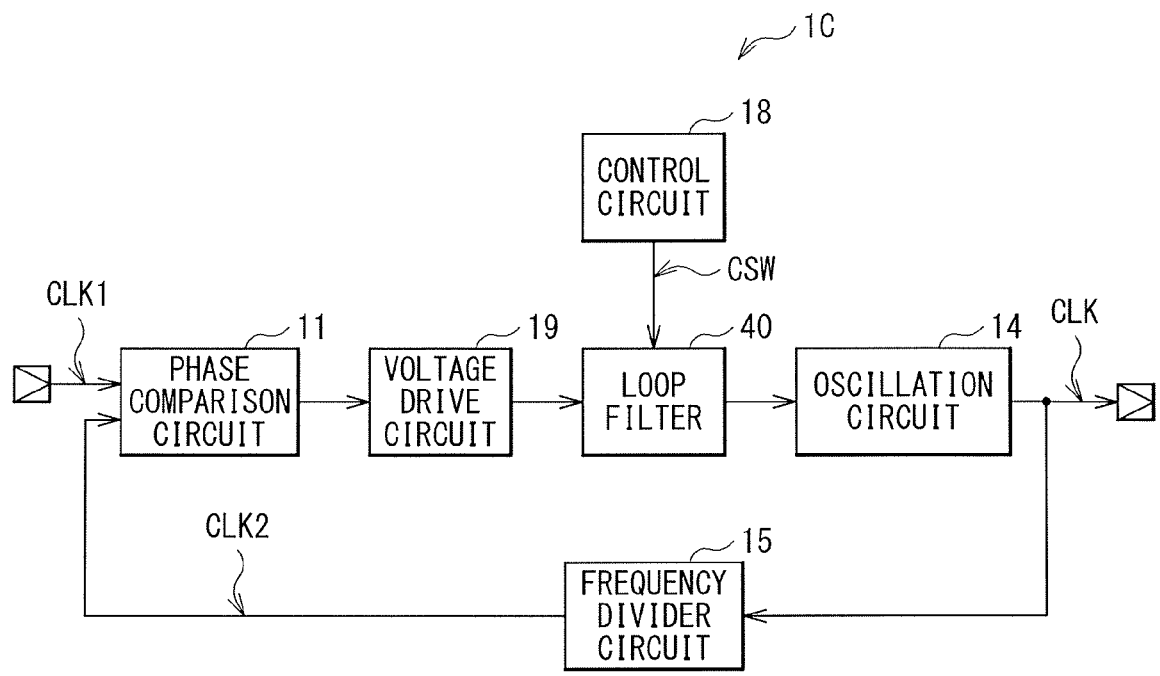
FIG. 14 is a block diagram illustrating an exemplary configuration of a phase locked loop circuit according to another modification of the first embodiment.

FIG. 14 illustrates an exemplary configuration of the phase locked loop circuit 1C. The phase locked loop circuit 1C includes a control circuit 18, a voltage drive circuit 19, and a loop filter 40.

The control circuit 18 sets an operation mode of the phase locked loop circuit 1C, and transmits the operation mode to the loop filter 40 through a control signal CSW.

The voltage drive circuit 19 operates based on a comparison result by a phase comparison circuit 11 and on a control signal CCP so as to selectively supply, to a loop filter 40, a voltage VH at a power voltage level or a voltage VL at a ground level, for example.

The loop filter 40 operates based on the control signal CSW so as to filter the voltage signal supplied from the voltage drive circuit 19 to generate a voltage Vctrl.

Figure 15:
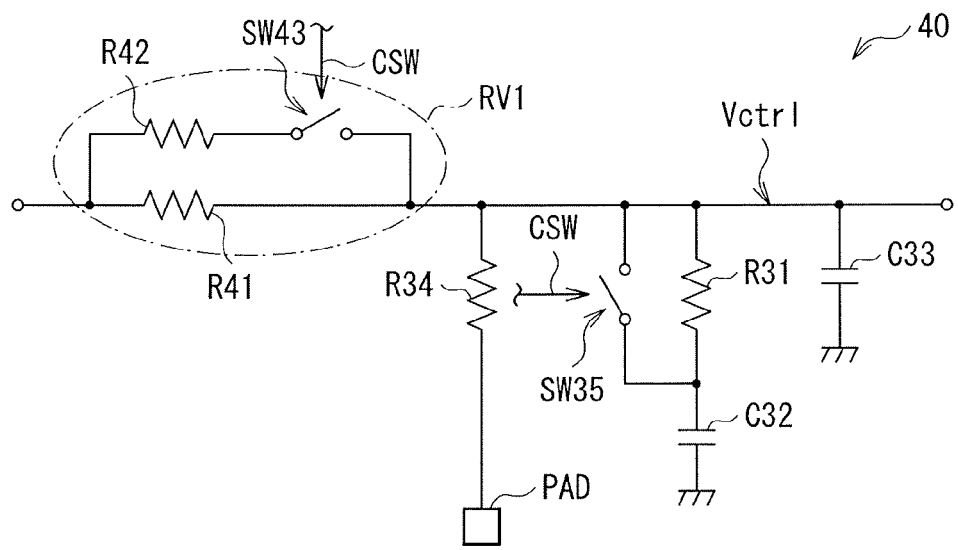
FIG. 15 is a circuit diagram illustrating an exemplary configuration of a loop filter illustrated in FIG. 14.

FIG. 15 illustrates an exemplary configuration of the loop filter 40. The loop filter 40 includes a variable resistance RV1 added to a prior stage of the loop filter 30 according to the first embodiment. The variable resistance RV1 includes resistors R41 and R42, and a switch SW43. The resistor R41 has a first end connected to a first end of the resistor R42 and an output terminal of the voltage drive circuit 19, and has a second end connected to a first end of each of resistors R31 and R34, a first end of a capacitor C33, a first end of a switch SW35, a second end of the switch SW43, and an input terminal of an oscillation circuit 14. The resistor R42 has a first end connected to the first end of the resistor R41 and the output terminal of the voltage drive circuit 19, and has a second end connected to a first end of the switch SW43. The switch SW43 is turned on or off based on the control signal CSW supplied from the control circuit 12, and has the first end connected to the second end of the resistor R42, and has the second end connected to the first end of each of the resistors R31 and R34, the first end of the capacitor C33, the first end of the switch SW35, the second end of the resistor R41, and the input terminal of the oscillation circuit 14. The switch SW43 is off in the operation mode M1 while being on in the operation mode M2. It is to be noted that the variable resistance RV1 do not limitedly have such a configuration, and may have any of other configurations.

The phase comparison circuit 11 and the voltage drive circuit 19 correspond to a specific but not limitative example of "phase comparison section" in one embodiment of the disclosure. The variable resistance RV1 corresponds to a specific but not limitative example of "eighth resistor" in one embodiment of the disclosure.

Figure 16A:
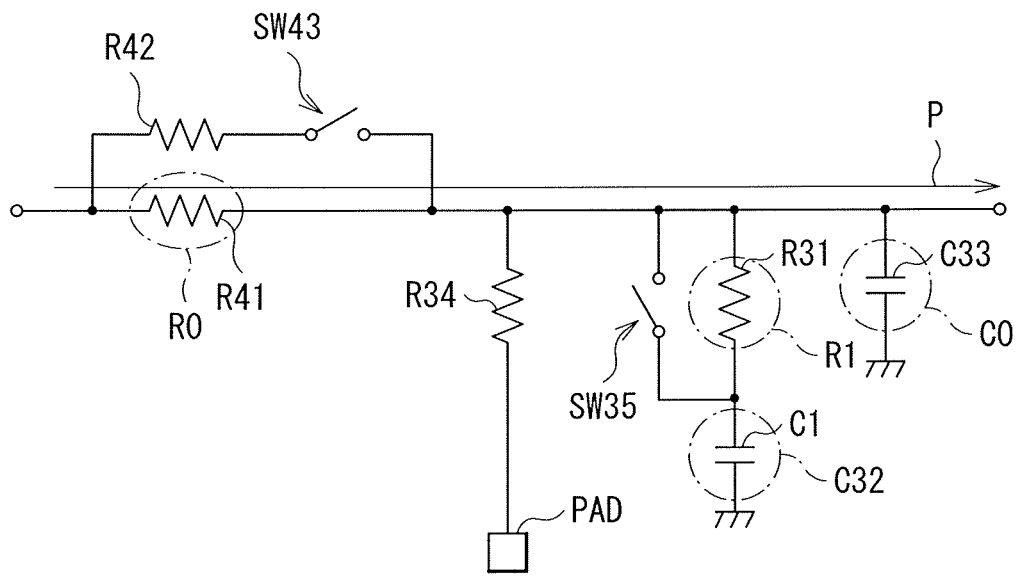
FIG. 16A is an explanatory diagram illustrating an exemplary operation of the loop filter illustrated in FIG. 14.
Figure 16B:
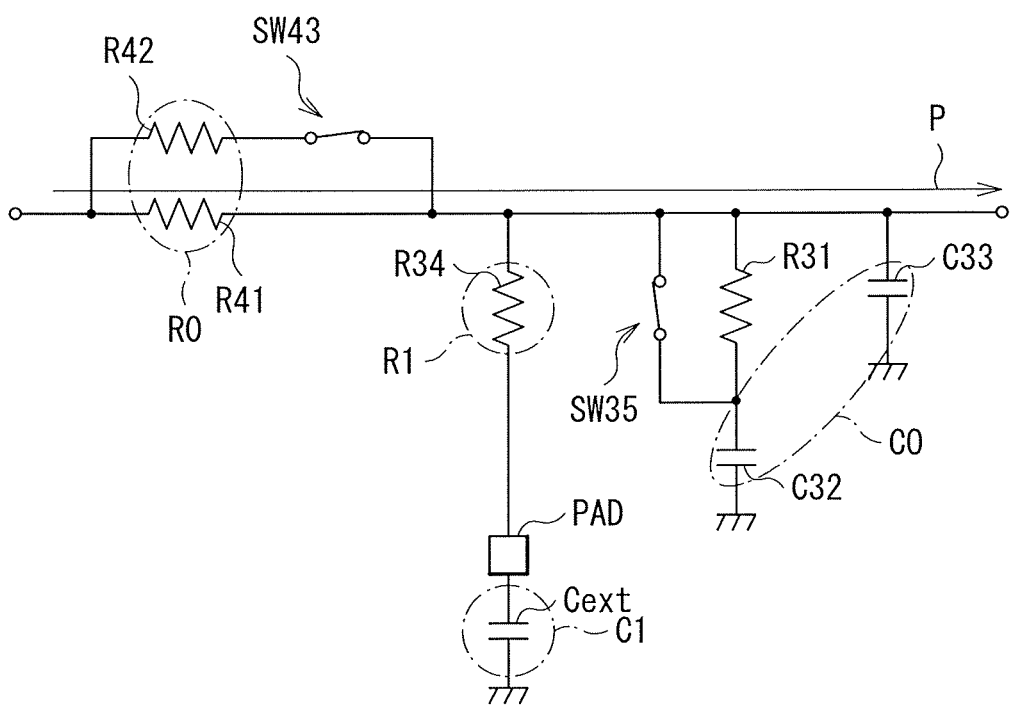
FIG. 16B is an explanatory diagram illustrating another exemplary operation of the loop filter illustrated in FIG. 14.

FIG. 16A illustrates an exemplary configuration of the loop filter 40 in the operation mode M1. FIG. 16B illustrates an exemplary configuration of the loop filter 40 in the operation mode M2. In the operation mode M1, as illustrated in FIG. 16A, the switches SW35 and SW43 are each off, and no external component is connected to the pad PAD. On the other hand, in the operation mode M2, as illustrated in FIG. 16B, the switches SW35 and SW43 are each on, and the capacitor Cext as the external component is connected to the pad PAD.

Figures 17, 18A, 18B:
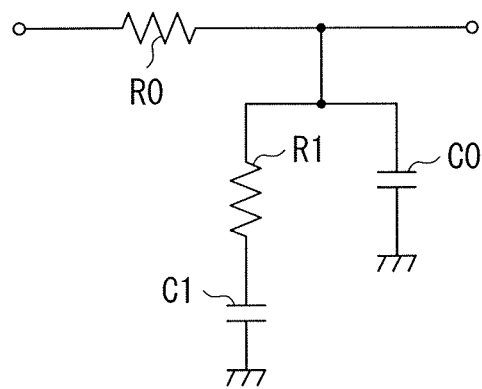
FIG. 17 is a circuit diagram illustrating an equivalent circuit of the loop filter illustrated in FIG. 14.
FIG. 18A is a Table illustrating a setting example of the loop filter illustrated in FIG. 14.
FIG. 18B is another Table illustrating the setting example of the loop filter illustrated in FIG. 14.

FIG. 17 illustrates an equivalent circuit of the loop filter 40. In the loop filter 40, an equivalent resistance R0 is inserted in series into a prior stage of the equivalent circuit of the loop filter 30 (FIG. 4). In other words, the loop filter 40 configures a so-called passive lag lead filter. In the operation mode M1, as illustrated in FIG. 16A, the resistor R41 corresponds to the equivalent resistance R0. In the operation mode M2, as illustrated in FIG. 16B, the resistors R41 and R42 collectively correspond to the equivalent resistance R0. Correspondence relationships between the resistors R31 and R34 and the equivalent resistance R1, between the capacitors C32 and C33 and the equivalent capacitance C0, and between the capacitor Cext and the equivalent capacitance C1 are similar to those in the first embodiment.

FIG. 18A illustrates a specific setting example of the loop filter 40. FIG. 18B illustrates values of the equivalent resistances R0 and R1 and values of the equivalent capacitances C0 and C1 in the setting as illustrated in FIG. 18A. As illustrated in FIG. 18A, the resistance value of the resistor R41 is set to 1 [Mohm], and the resistance value of the resistor R42 is set to 10.1 [kohm]. Consequently, as illustrated in FIG. 18B, it is possible to adjust the value of the equivalent resistance R0 to be 1 [Mohm] in the operation mode M1, and to be 10 [kohm] in the operation mode M2. In other words, the value of the equivalent resistance R0 in the operation mode M2 is adjusted to be 1/100 of the value thereof in the case of the operation mode M1. This results in the same effects as those in the first embodiment in the case where the value of the current Icp in the operation mode M2 is adjusted to be 100 times larger than the value thereof in the operation mode M1. Consequently, the phase locked loop circuit 1B achieves substantially the same response characteristics and stability between the operation modes M1 and M2.

Although the passive lag lead filter is used in the Modification 1-2, this is not limitative. Alternatively, for example, an active lag lead filter may be used.

[Modification 1-3]

Figure 19:
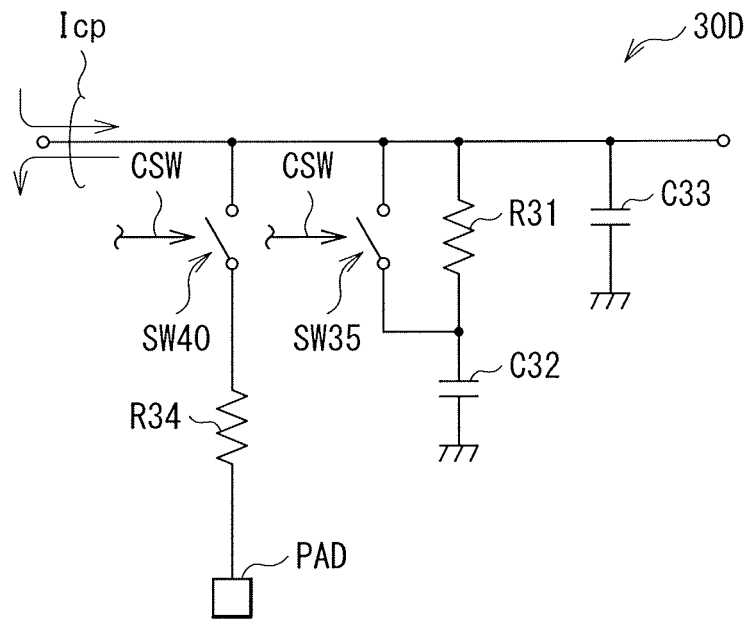
FIG. 19 is a circuit diagram illustrating an exemplary configuration of a loop filter according to another modification of the first embodiment.

Although the first end of the resistor R34 is connected to the first end of the resistor R31, the first end of the capacitor C33, and the first end of the switch SW35 in the first embodiment, this is not limitative. Alternatively, for example, as with a loop filter 30D illustrated in FIG. 19, the first end of the resistor R34 may be connected to the first end of the resistor R31, the first end of the capacitor C33, and the first end of the switch SW35 via a switch SW40. The switch SW40 is turned on or off based on the control signal CSW, and is off in the operation mode M1 while being on in the operation mode M2. According to such a configuration, it is possible to reduce influence of parasitic capacitance of the pad PAD, etc. on circuit operation in the operation mode M1.

2. Second Embodiment

A phase locked loop circuit 2 according to a second embodiment is now described. A loop filter in the second embodiment has a configuration different from that of the loop filter 30 according to the first embodiment. Other configurations are similar to those in the first embodiment (FIG. 1 and the like). It is to be noted that substantially the same components as those of the phase locked loop circuit 1 according to the first embodiment are designated by the same numerals, and description of them is appropriately omitted. As illustrated in FIG. 1, the phase locked loop circuit 2 includes a loop filter 50.

Figure 20:
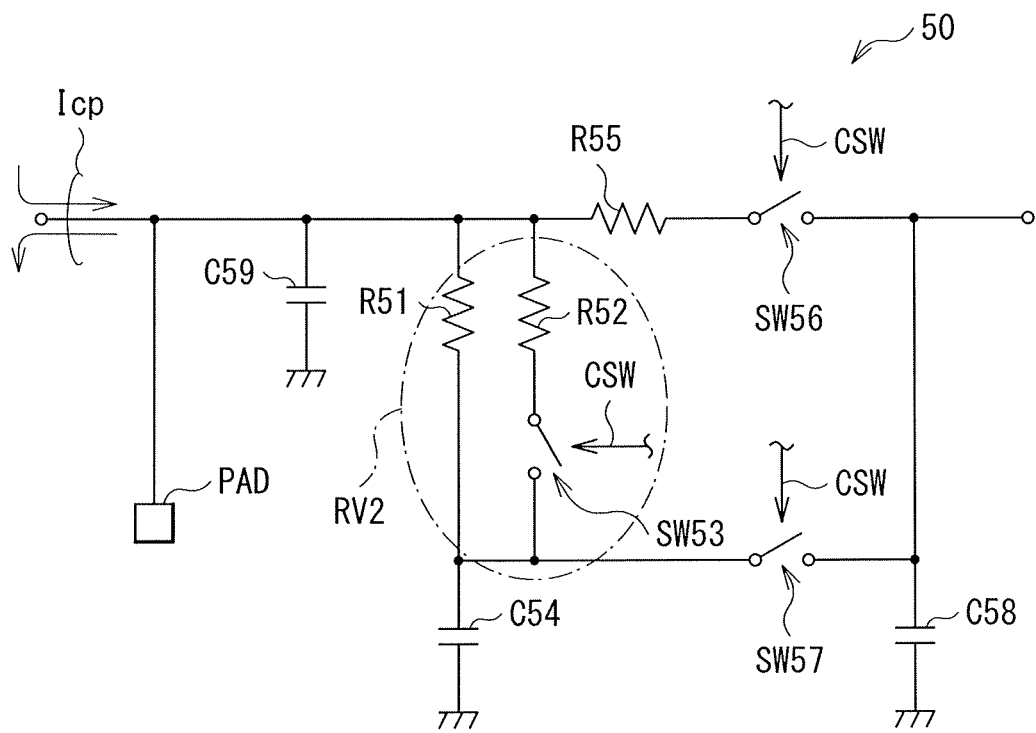
FIG. 20 is a circuit diagram illustrating an exemplary configuration of a loop filter according to a second embodiment.

FIG. 20 illustrates an exemplary configuration of the loop filter 50 according to the second embodiment. The loop filter 50 includes a variable resistance RV2, capacitors C54, C58, and C59, a resistor R55, and switches SW56 and SW57.

The variable resistance RV2 includes resistors R51 and R52 and a switch SW53. The resistor R51 has a first end connected to a first end of each of the resistors R52 and R55, a first end of the capacitor C59, and an output terminal of a charge pump 20, and has a second end connected to a second end of the switch SW53, a first end of the capacitor C54, and a first end of the switch SW57. The resistor R52 has a first end connected to the first end of each of the resistors R51 and R55, the first end of the capacitor C59, and the output terminal of the charge pump 20, and has a second end connected to a first end of the switch SW53. The switch SW53 is turned on or off based on the control signal CSW, and has the first end connected to the second end of the resistor R52, and has the second end connected to the second end of the resistor R51, the first end of the capacitor C54, and the first end of the switch SW57. The switch SW53 is off in the operation mode M1 while being on in the operation mode M2. It is to be noted that the variable resistance RV2 do not limitedly have such a configuration, and may have any of other configurations.

The capacitor C54 has the first end connected to the second end of the resistor R51, the second end of the switch SW53, and the first end of the switch SW57, and has a second end being grounded. The resistor R55 has the first end connected to the first end of each of the resistors R51 and R55, the first end of the capacitor C59, and the output terminal of the charge pump 20, and has a second end connected to a first end of the switch SW56. The switch SW56 is turned on or off based on the control signal CSW, and has the first end connected to the second end of the resistor R55, and has a second end connected to a second end of the switch SW57, a first end of the capacitor C58, and an input terminal of the oscillation circuit 14. The switch SW56 is on in the operation mode M1 while being off in the operation mode M2. The switch SW57 is turned on or off based on the control signal CSW, and has the first end connected to the second end of the resistor R51, the second end of the switch SW53, and the first end of the capacitor C54, and has the second end connected to the second end of the switch SW56, the first end of the capacitor C58, and the input terminal of the oscillation circuit 14. The switch SW57 is off in the operation mode M1 while being on in the operation mode M2. The capacitor C58 has the first end connected to the second end of each of the switches SW56 and SW57 and the input terminal of the oscillation circuit 14, and has a second end being grounded. The capacitor C59 has the first end connected to the first end of each of the resistors R51, R52, and R55, and the output terminal of the charge pump 20, and has a second end being grounded. A pad PAD is connected to the first end of each of the resistors R51, R52, and R55, the first end of the capacitor C59, and the output terminal of the charge pump 20.

The variable resistance RV2 corresponds to a specific but not limitative example of "first resistor" in one embodiment of the disclosure. The capacitor C54 corresponds to a specific but not limitative example of "first capacitor" in one embodiment of the disclosure. The switch SW57 corresponds to a specific but not limitative example of "first switch" in one embodiment of the disclosure. The capacitor C58 corresponds to a specific but not limitative example of "second capacitor" in one embodiment of the disclosure. The capacitor C59 corresponds to a specific but not limitative example of "sixth capacitor" in one embodiment of the disclosure. The resistor R55 corresponds to a specific but not limitative example of "sixth resistor" in one embodiment of the disclosure. The switch SW56 corresponds to a specific but not limitative example of "fifth switch" in one embodiment of the disclosure.

Figure 21A:
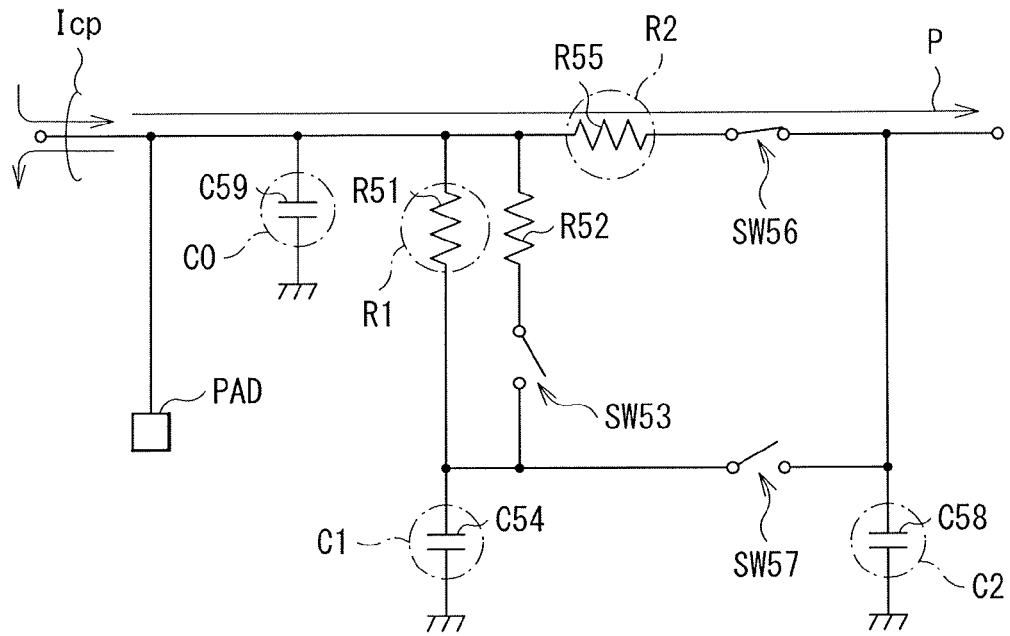
FIG. 21A is an explanatory diagram illustrating an exemplary operation of the loop filter illustrated in FIG. 20.
Figure 21B:
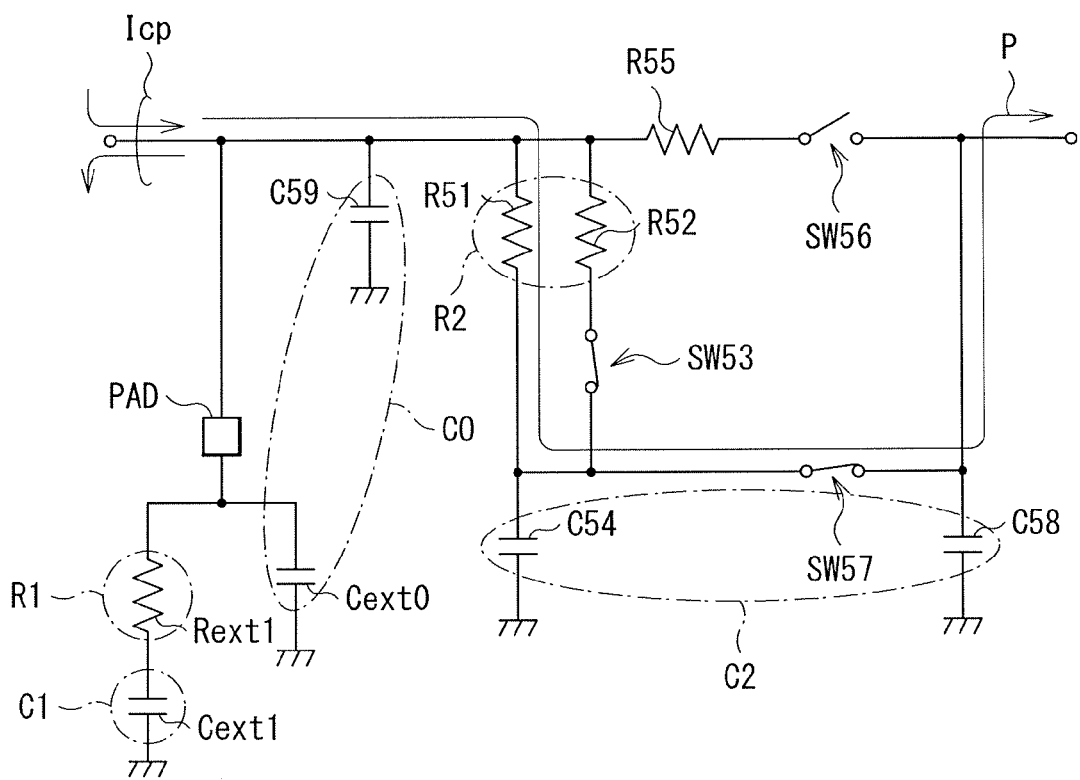
FIG. 21B is an explanatory diagram illustrating an exemplary operation of the loop filter illustrated in FIG. 20.

FIG. 21A illustrates an exemplary configuration of the loop filter 50 in the operation mode M1. FIG. 21B illustrates an exemplary configuration of the loop filter 50 in the operation mode M2. In the operation mode M1, as illustrated in FIG. 21A, the switches SW53 and SW57 are each off while the switch SW56 is on, and no external component is connected to the pad PAD. In this case, a path running through the resistor R2 and the switch SW56 serves as the signal path P. On the other hand, in the operation mode M2, as illustrated in FIG. 21B, the switches SW53 and SW57 are each on while the switch SW56 is off, and external components (a resistor Rext1 and capacitors Cext0 and Cext1) are connected to the pad PAD. Specifically, the resistor Rext1 has a first end connected to a first end of the capacitor Cext0 and the pad PAD, and has a second end connected to the capacitor Cext1. The capacitor Cext0 has the first end connected to the first end of the resistor Rext1 and the pad PAD, and has a second end being grounded. The capacitor Cext1 has the first end connected to the second end of the resistor Rext1, and has a second end being grounded. In this case, a path running through the variable resistance RV2 (the resistors R51 and R52 and the switch SW53) serves as the signal path P.

The equivalent circuit of the loop filter 50 is the same as that illustrated in FIG. 10. In other words, the phase locked loop circuit 2 using the loop filter 50 is a tertiary phase locked loop circuit.

In the operation mode M1, as illustrated in FIG. 21A, the resistor R51 corresponds to the equivalent resistance R1, the resistor R55 corresponds to the equivalent resistance R2, the capacitor C59 corresponds to the equivalent capacitance C0, the capacitor C54 corresponds to the equivalent capacitance C1, and the capacitor C58 corresponds to the equivalent capacitance C2. Since the switch SW53 is off, the resistor R52 is electrically negligible.

On the other hand, in the operation mode M2, as illustrated in FIG. 21B, the resistor Rext1 corresponds to the equivalent resistance R1, the resistors R51 and R52 collectively correspond to the equivalent resistance R2, the capacitors Cext0 and C59 collectively correspond to the equivalent capacitance C0, the capacitor Cext1 corresponds to the equivalent capacitance C1, and the capacitors C54 and C58 collectively correspond to the equivalent capacitance C2. Since the switch SW56 is off, the resistor R55 is electrically negligible.

In this way, in the phase locked loop circuit 2, the switch SW57 is connected to the first end of the capacitor C54 to switch the role of the capacitor C54 between the operation modes M1 and M2. Specifically, the capacitor C54 configures the equivalent capacitance C1 in the operation mode M1 (FIG. 21A), while configuring the equivalent capacitance C2 together with the capacitor C58 in the operation mode M2 (FIG. 21B). Consequently, since the capacitor C54 is usable in each of the operation modes M1 and M2, it is possible to effectively use chip area.

Furthermore, in the phase locked loop circuit 2, the first end of the capacitor C58 is connected to the signal path P in each of the operation modes M1 and M2. Specifically, the capacitor C58 singly configures the equivalent capacitance C2 in the operation mode M1 (FIG. 21A), and configures the equivalent capacitance C2 together with the capacitor C54 in the operation mode M2 (FIG. 21B). In this way, in the phase locked loop circuit 2, since the capacitor C58 is usable in each of the operation modes M1 and M2, it is possible to effectively use chip area.

Furthermore, in the phase locked loop circuit 2, the first end of the capacitor C59 is connected to the signal path P in each of the operation modes M1 and M2. Specifically, the capacitor C59 singly configures the equivalent capacitance C0 in the operation mode M1 (FIG. 21A), and configures the equivalent capacitance C0 together with the capacitor Cext0 in the operation mode M2 (FIG. 21B). In this way, in the phase locked loop circuit 2, since the capacitor C59 is usable in each of the operation modes M1 and M2, it is possible to effectively use chip area.

FIG. 22A illustrates a specific setting example of each of the charge pump 20 and the loop filter 40. FIG. 22B illustrates values of the equivalent resistances R1 and R2 and values of the equivalent capacitances C0 to C2 in the setting as illustrated in FIG. 22A.

In the loop filter 50, as illustrated in FIG. 22A, the resistance value of the resistor R51 is set to 100 [kohm], and the resistance value of the resistor Rext1 is set to 1 [kohm]. Consequently, as illustrated in FIG. 22B, it is possible to adjust the value of the equivalent resistance R1 to be 100 [kohm] in the operation mode M1, and to be 1 [kohm] in the operation mode M2. In other words, it is possible to adjust the value of the equivalent resistance R1 in the operation mode M2 to be 1/100 of the value thereof in the case of the operation mode M1.

Furthermore, in the loop filter 50, as illustrated in FIG. 22A, the resistance value of the resistor R55 is set to 100 [kohm], the resistance value of the resistor R51 is set to 100 [kohm], and the resistance value of the resistor R52 is set to 1.01 [kohm]. Consequently, as illustrated in FIG. 22B, it is possible to adjust the value of the equivalent resistance R2 to be 100 [kohm] in the operation mode M1, and to be 1 [kohm] in the operation mode M2. In other words, it is possible to adjust the value of the equivalent resistance R2 in the operation mode M2 to be 1/100 of the value thereof in the case of the operation mode M1.

Furthermore, in the loop filter 50, as illustrated in FIG. 22A, the capacitance value of the capacitor C59 is set to 1 [pF], and the capacitance value of the capacitor Cext0 is set to 100 [pF]. Consequently, as illustrated in FIG. 22B, it is possible to adjust the value of the equivalent capacitance C0 to be 1 [pF] in the operation mode M1, and to be 101 [pF] in the operation mode M2. In other words, it is possible to adjust the value of the equivalent capacitance C0 in the operation mode M2 to be about 100 times larger than the value thereof in the case of the operation mode M1.

Furthermore, in the loop filter 50, as illustrated in FIG. 22A, the capacitance value of the capacitor C54 is set to 100 [pF], and the capacitance value of the capacitor Cext1 is set to 10 [nF]. Consequently, as illustrated in FIG. 22B, it is possible to adjust the value of the equivalent capacitance C1 to be 100 [pF] in the operation mode M1, and to be 10 [nF] in the operation mode M2. In other words, it is possible to adjust the value of the equivalent capacitance C1 in the operation mode M2 to be 100 times larger than the value thereof in the case of the operation mode M1.

Furthermore, in the loop filter 50, as illustrated in FIG. 22A, the capacitance value of the capacitor C58 is set to 1 [pF], and the capacitance value of the capacitor C54 is set to 100 [pF]. Consequently, as illustrated in FIG. 22B, it is possible to adjust the value of the equivalent capacitance C2 to be 1 [pF] in the operation mode M1, and to be 101 [pF] in the operation mode M2. In other words, it is possible to adjust the value of the equivalent capacitance C2 in the operation mode M2 to be about 100 times larger than the value thereof in the case of the operation mode M1.

In this way, the value of each of the equivalent resistances R1 and R2 in the operation mode M2 is 1/100 of the value thereof in the case of the operation mode M1. The value of each of the equivalent capacitances C0 to C2 in the operation mode M2 is about 100 times larger than the value thereof in the case of the operation mode M1. Consequently, the transimpedance of the loop filter 50 in the operation mode M2 is about 1/100 of that in the case of the operation mode M1. On the other hand, the value of the current Icp in the operation mode M2 is 100 times larger than the value thereof in the case of the operation mode M1. Hence, substantially the same closed-loop transfer function is given regardless of the operation mode M1 or M2. Consequently, the phase locked loop circuit 2 achieves substantially the same response characteristics and stability between the operation modes M1 and M2.

Such a configuration also provides effects similar to those in the first embodiment.

[Modification 2-1]

Although the pad PAD is connected to the first end of each of the resistors R51, R52, and R55, the first end of the capacitor C59, and the output terminal of the charge pump 20 in the second embodiment, this is not limitative. Alternatively, for example, there may be provided a configuration of each of loop filters 50A to 50C described below.

Figure 23A:
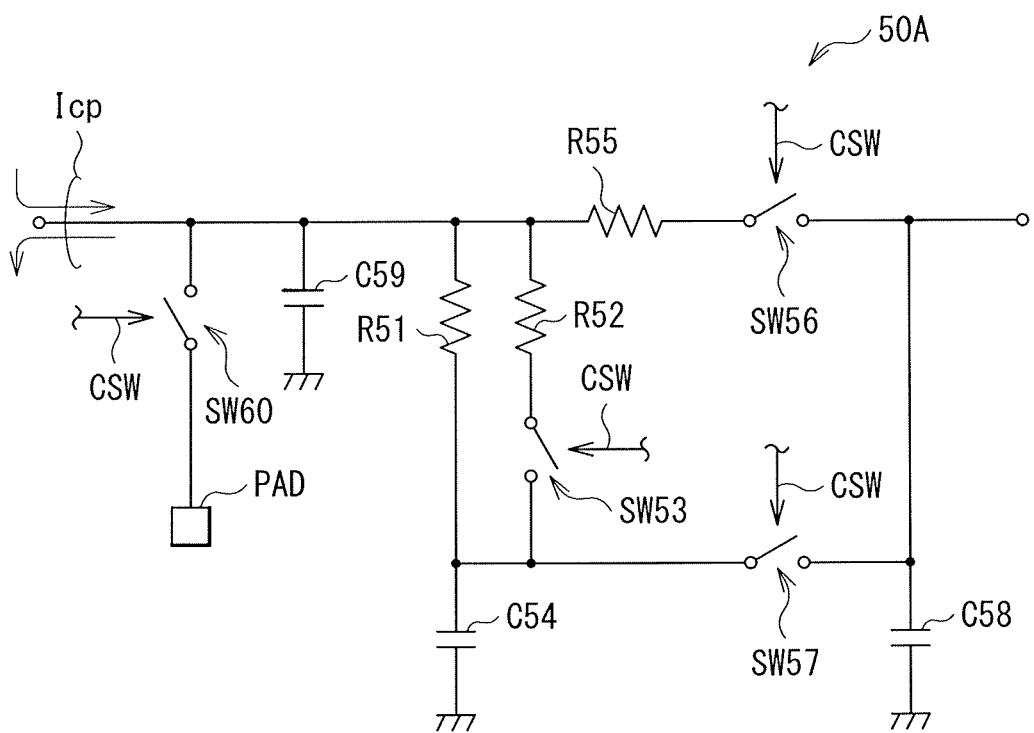
FIG. 23A is a circuit diagram illustrating an exemplary configuration of a loop filter according to a modification of the second embodiment.

FIG. 23A illustrates an exemplary configuration of the loop filter 50A according to Modification 2-1. In this loop filter 50A, the pad PAD is connected to the first end of each of the resistors R51, R52, and R55, the first end of the capacitor C59, and the output terminal of the charge pump 20 via the switch SW60. The switch SW60 is turned on or off based on the control signal CSW, and is off in the operation mode M1 while being on in the operation mode M2. According to such a configuration, it is possible to reduce influence of parasitic capacitance of the pad PAD, etc. on circuit operation in the operation mode M1.

Figure 23B:
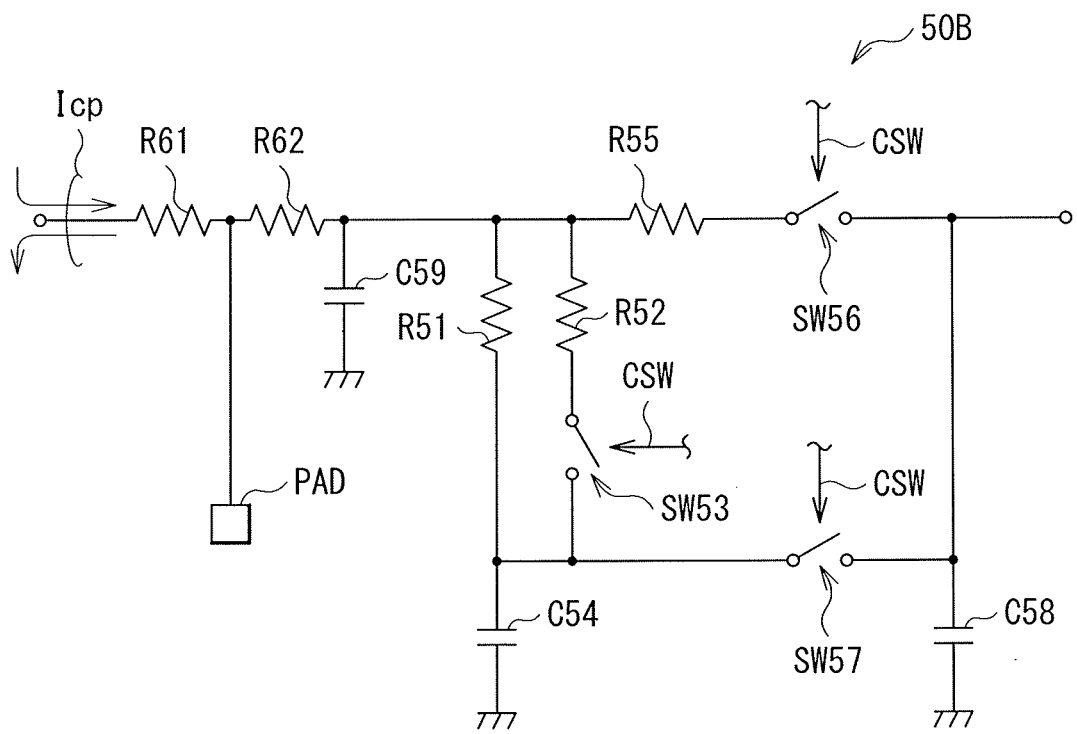
FIG. 23B is a circuit diagram illustrating an exemplary configuration of a loop filter according to another modification of the second embodiment.

FIG. 23B illustrates an exemplary configuration of the loop filter 50B according to the Modification 2-1. In this loop filter 50B, the pad PAD is connected to the output terminal of the charge pump 20 via the resistor R61, and connected to the first end of each of the resistors R51, R52, and R55, and the first end of the capacitor C59 via the resistor R62. According to such a configuration, it is possible to reduce a possibility of circuit breakdown when electro-static discharge (ESD) stress is applied to the pad PAD.

Figure 23C:
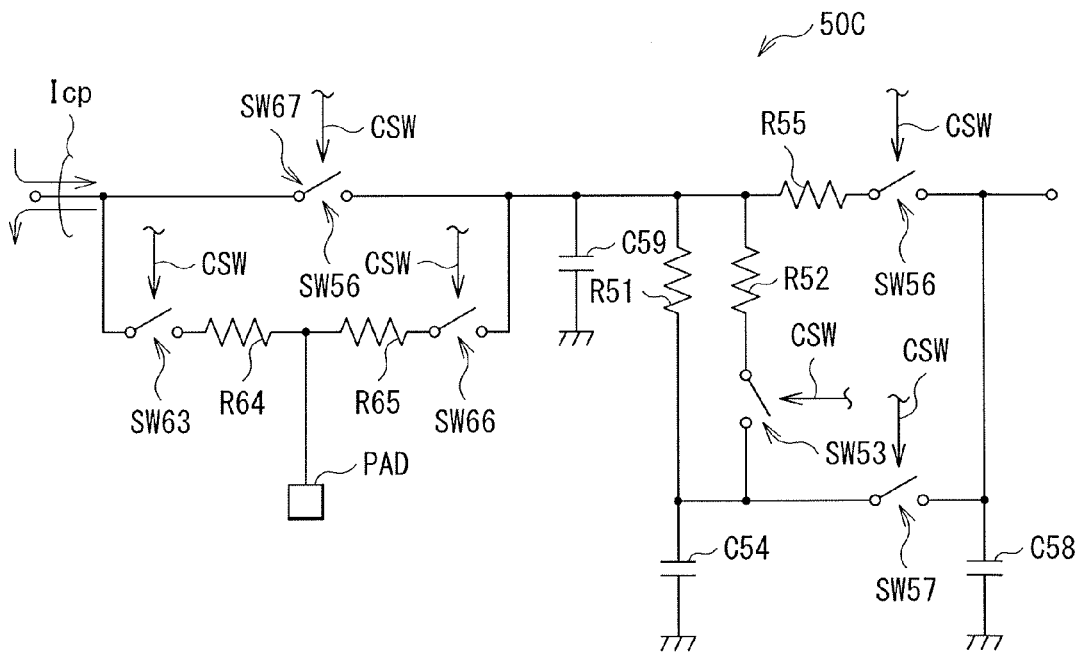
FIG. 23C is a circuit diagram illustrating an exemplary configuration of a loop filter according to another modification of the second embodiment.

FIG. 23C illustrates an exemplary configuration of the loop filter 50C according to the Modification 2-1. The loop filter 50C includes switches SW63, SW66, and SW67 and resistors R64 and R65. The switch SW63 is turned on or off based on the control signal CSW, and has a first end connected to a first end of the switch SW67 and the output terminal of the charge pump 20, and has a second end connected to the resistor R64. The switch SW63 is off in the operation mode M1 while being on in the operation mode M2. The resistor R64 has a first end connected to the second end of the switch SW63, and has a second end connected to a first end of the resistor R65 and the pad PAD. The resistor R65 has a first end connected to the second end of the resistor R64 and the pad PAD, and has a second end connected to a first end of the switch SW66. The switch SW66 is turned on or off based on the control signal CSW, and has the first end connected to the second end of the resistor R65, and has a second end connected to the first end of each of the resistors R51, R52, and R55, the first end of the capacitor C59, and a second end of the switch SW67. The switch SW66 is off in the operation mode M1 while being on in the operation mode M2. The switch SW67 is turned on or off based on the control signal CSW, and has a first end connected to a first end of the switch SW63 and the output terminal of the charge pump 20, and has the second end connected to the first end of each of the resistors R51, R52, and R55, the first end of the capacitor C59, and the second end of the switch SW66. The switch SW67 is on in the operation mode M1 while being off in the operation mode M2. In this configuration, in the operation mode M1, the switch SW67 is on, while the switches SW63 and SW66 are off. In the operation mode M2, the switch SW67 is off while the switches SW63 and SW66 are on, and external components are connected to the loop filter 50C via the pad PAD. According to such a configuration, it is possible to reduce a possibility of circuit breakdown when electro-static discharge (ESD) stress is applied to the pad PAD, and to reduce influence of parasitic capacitance of the pad PAD, etc. on circuit operation in the operation mode M1.

[Modification 2-2]

The Modifications 1-1 and 1-2 of the first embodiment may each be applied to the loop filter 50 according to the second embodiment.

3. Third Embodiment

A phase locked loop circuit 3 according to a third embodiment is now described. In the third embodiment, a loop filter has a configuration different from that of each of the loop filter 30 according to the first embodiment and the loop filter 50 according to the second embodiment. Other configurations are similar to those in the first embodiment (FIG. 1 and the like). It is to be noted that substantially the same components as those of the phase locked loop circuit 1 according to the first embodiment are designated by the same numerals, and description of them is appropriately omitted. As illustrated in FIG. 1, the phase locked loop circuit 3 includes a loop filter 70.

Figure 24:
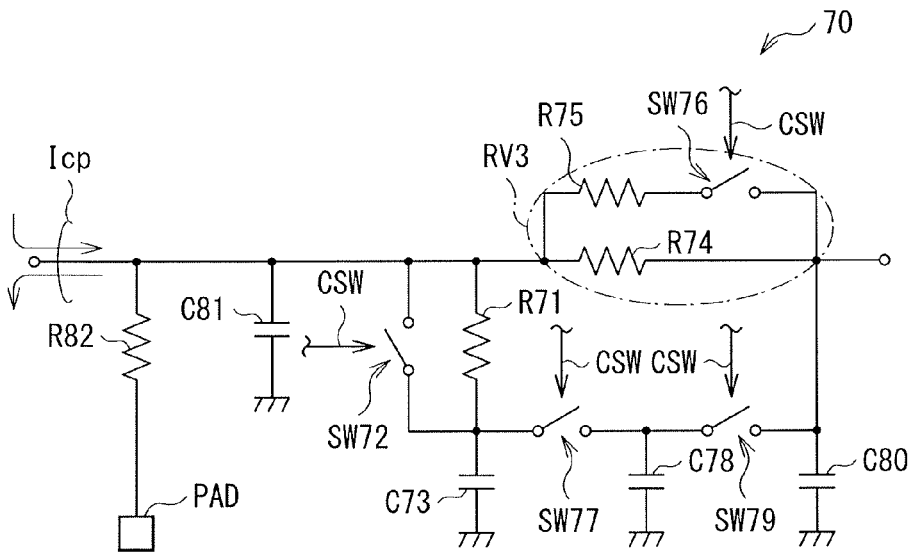
FIG. 24 is a circuit diagram illustrating an exemplary configuration of a loop filter according to a third embodiment.

FIG. 24 illustrates an exemplary configuration of the loop filter 70 according to the third embodiment. The loop filter 70 includes a variable resistance RV3, resistors R71 and R82, switches SW72, SW77, and SW79, and capacitors C73, C78, C80, and C81.

The variable resistance RV3 includes resistors R74 and R75 and a switch SW76. The resistor R74 has a first end connected to a first end of each of the resistors R71, R75, and R82, a first end of the switch SW72, a first end of the capacitor C81, and an output terminal of a charge pump 20, and has a second end connected to a second end of each of the switches SW76 and SW79, a first end of the capacitor C80, and an input terminal of an oscillation circuit 14. The resistor R75 has a first end connected to the first end of each of the resistors R71, R74, and R82, the first end of the switch SW72, the first end of the capacitor C81, and the output terminal of the charge pump 20, and has a second end connected to a first end of the switch SW76. The switch SW76 is turned on or off based on the control signal CSW, and has the first end connected to the second end of the resistor R75, and has the second end connected to the second end of the resistor R74, the second end of the switch SW79, the first end of the capacitor C80, and the input terminal of the oscillation circuit 14. The switch SW76 is off in the operation mode M1 while being on in the operation mode M2. It is to be noted that the variable resistance RV3 do not limitedly have such a configuration, and may have any of other configurations.

The resistor R71 has the first end connected to the first end of each of the resistors R74, R75, and R82, the first end of the switch SW72, the first end of the capacitor C81, and the output terminal of the charge pump 20, and has a second end connected to a second end of the switch SW72, a first end of the capacitor C73, and a first end of the switch SW77. The switch SW72 is turned on or off based on the control signal CSW, and has the first end connected to the first end of each of the resistors R71, R74, R75, and R82, the first end of the capacitor C81, and the output terminal of the charge pump 20, and has the second end connected to the second end of the resistor R71, the first end of the capacitor C73, and the first end of the switch SW77. The switch SW72 is off in the operation mode M1 while being on in the operation mode M2. The capacitor C73 has the first end connected to the second end of the resistor R71, the second end of the switch SW72, and the first end of the switch SW77, and has a second end being grounded. The switch SW77 is turned on or off based on the control signal CSW, and has the first end connected to the second end of the resistor R71, the second end of the switch SW72, and the first end of the capacitor C73, and has a second end connected to a first end of the capacitor C78 and a first end of the switch SW79. The switch SW77 is on in the operation mode M1 while being off in the operation mode M2. The capacitor C78 has the first end connected to the second end of the switch SW77 and the first end of the switch SW79, and has a second end being grounded. The switch SW79 is turned on or off based on the control signal CSW, and has the first end connected to the second end of the switch SW77 and the first end of the capacitor C78, and has the second end connected to the second end of the resistor R74, the second end of the switch SW76, the first end of the capacitor C80, and the input terminal of the oscillation circuit 14. The switch SW79 is off in the operation mode M1 while being on in the operation mode M2. The capacitor C80 has the first end connected to the second end of the resistor R74, the second end of each of the switches SW76 and SW79, and the input terminal of the oscillation circuit 14, and has a second end being grounded. The capacitor C81 has the first end connected to the first end of each of the resistors R71, R74, R75, and R82, the first end of the switch SW72, and the output terminal of the charge pump 20, and has a second end being grounded. The resistor R82 has the first end connected to the first end of each of the resistors R71, R74, and R75, the first end of the capacitor C81, the first end of the switch SW72, and the output terminal of the charge pump 20, and has a second end connected to the pad PAD.

The resistor R71 corresponds to a specific but not limitative example of "first resistor" in one embodiment of the disclosure. The capacitor C73 corresponds to a specific but not limitative example of "first capacitor" in one embodiment of the disclosure. The switch SW72 corresponds to a specific but not limitative example of "first switch" in one embodiment of the disclosure. The capacitor C81 corresponds to a specific but not limitative example of "second capacitor" in one embodiment of the disclosure. The switch SW77 corresponds to a specific but not limitative example of "second switch" in one embodiment of the disclosure. The capacitor C78 corresponds to a specific but not limitative example of "fourth capacitor" in one embodiment of the disclosure. The switch SW79 corresponds to a specific but not limitative example of "third switch" in one embodiment of the disclosure. The capacitor C80 corresponds to a specific but not limitative example of "fifth capacitor" in one embodiment of the disclosure. The variable resistance RV3 corresponds to a specific but not limitative example of "third resistor" in one embodiment of the disclosure.

Figure 25A:
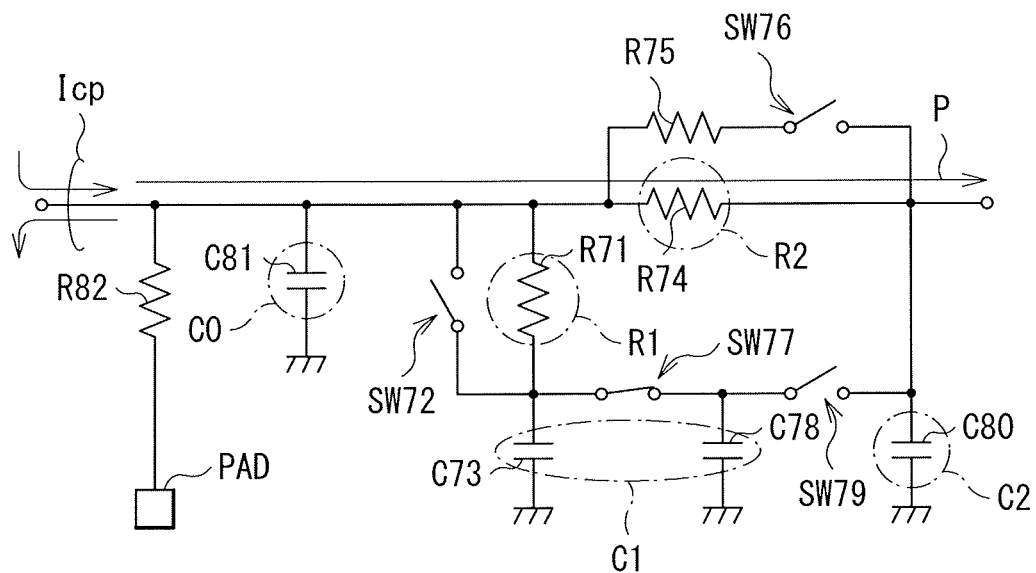
FIG. 25A is an explanatory diagram illustrating an exemplary operation of the loop filter illustrated in FIG. 24.
Figure 25B:
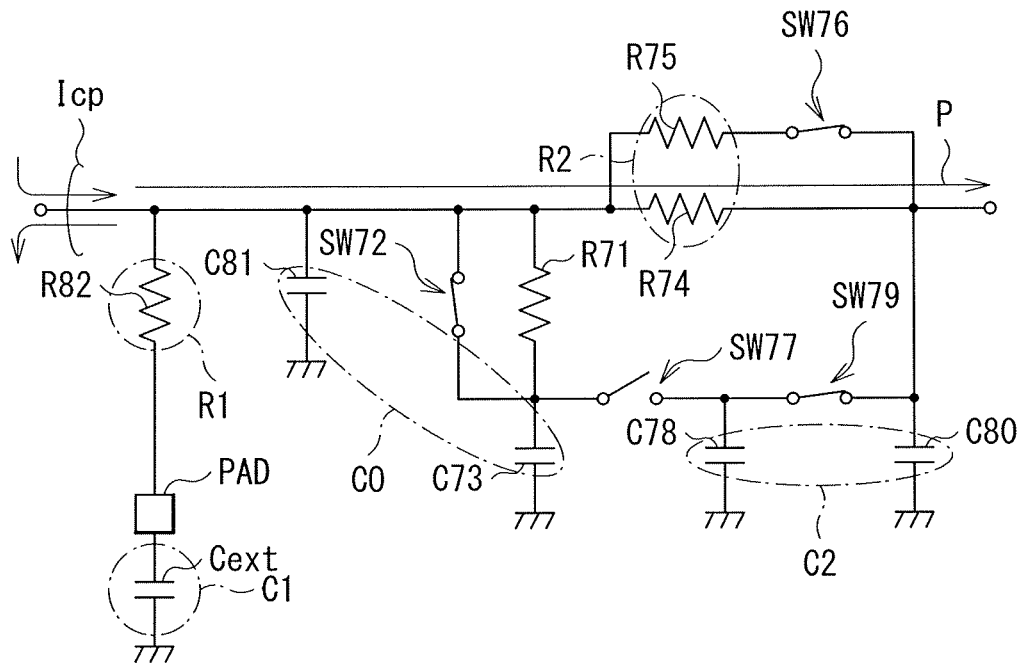
FIG. 25B is an explanatory diagram illustrating another exemplary operation of the loop filter illustrated in FIG. 24.

FIG. 25A illustrates an exemplary configuration of the loop filter 70 in the operation mode M1. FIG. 25B illustrates an exemplary configuration of the loop filter 70 in the operation mode M2. In the operation mode M1, as illustrated in FIG. 25A, the switches SW72, SW76, and SW79 are each off while the switch SW77 is on, and no external component is connected to the pad PAD. On the other hand, in the operation mode M2, as illustrated in FIG. 25B, the switches SW72, SW76, and SW79 are each on while the switch SW77 is off, and a capacitor Cext as an external component is connected to the pad PAD. Hence, a path running through the variable resistance RV3 (the resistors R74 and R75, and the switch SW76) serves as the signal path P regardless of the operation mode M1 or M2.

The equivalent circuit of the loop filter 70 is the same as that illustrated in FIG. 10. In other words, the phase locked loop circuit 3 using the loop filter 70 is a tertiary phase locked loop circuit.

In the operation mode M1, as illustrated in FIG. 25A, the resistor R71 corresponds to the equivalent resistance R1, the resistor R74 corresponds to the equivalent resistance R2, the capacitor C81 corresponds to the equivalent capacitance C0, the capacitors C73 and C78 collectively correspond to the equivalent capacitance C1, and the capacitor C80 corresponds to the equivalent capacitance C2. Since the switch SW76 is off, the resistor R75 is electrically negligible. In addition, since no external component is connected to the pad PAD, the resistor R82 is electrically negligible.

On the other hand, in the operation mode M2, as illustrated in FIG. 25B, the resistor R82 corresponds to the equivalent resistance R1, the resistors R74 and R75 collectively correspond to the equivalent resistance R2, the capacitors C73 and C81 collectively correspond to the equivalent capacitance C0, the capacitor Cext corresponds to the equivalent capacitance C1, and the capacitors C78 and C80 collectively correspond to the equivalent capacitance C2. Since the switch SW72 is on, the resistor R71 is electrically negligible.

In this way, in the phase locked loop circuit 3, the switches SW72 and SW77 are connected to the first end of the capacitor C73 to switch the role of the capacitor C73 between the operation modes M1 and M2. Specifically, the capacitor C73 configures the equivalent capacitance C1 together with the capacitor C78 in the operation mode M1 (FIG. 25A), while configuring the equivalent capacitance C0 together with the capacitor C81 in the operation mode M2 (FIG. 25B). Consequently, since the capacitor C73 is usable in each of the operation modes M1 and M2, it is possible to effectively use chip area.

Furthermore, in the phase locked loop circuit 3, the first end of the capacitor C81 is connected to the signal path P in each of the operation modes M1 and M2. Specifically, the capacitor C81 singly configures the equivalent capacitance C0 in the operation mode M1 (FIG. 25A), and configures the equivalent capacitance C0 together with the capacitor C73 in the operation mode M2 (FIG. 25B). In this way, in the phase locked loop circuit 3, since the capacitor C81 is usable in each of the operation modes M1 and M2, it is possible to effectively use chip area.

FIG. 26A illustrates a specific setting example of each of the charge pump 20 and the loop filter 70. FIG. 26B illustrates values of the equivalent resistances R1 and R2 and values of the equivalent capacitances C0 to C2 in the setting as illustrated in FIG. 26A.

In the charge pump 20, as illustrated in FIGS. 26A and 26B, a value of the current Icp is set to I [mA] in the operation mode M1, and set to I×50 [mA] in the operation mode M2. In other words, it is possible to adjust the value of the current Icp in the operation mode M2 to be 50 times larger than the value thereof in the case of the operation mode M1.

In the loop filter 70, as illustrated in FIG. 26A, the resistance value of the resistor R71 is set to 100 [kohm], and the resistance value of the resistor R82 is set to 2 [kohm]. Consequently, as illustrated in FIG. 26B, it is possible to adjust the value of the equivalent resistance R1 to be 100 [kohm] in the operation mode M1, and to be 2 [kohm] in the operation mode M2. In other words, it is possible to adjust the value of the equivalent resistance R1 in the operation mode M2 to be 1/50 of the value thereof in the case of the operation mode M1.

Furthermore, in the loop filter 70, as illustrated in FIG. 26A, the resistance value of the resistor R74 is set to 100 [kohm], and the resistance value of the resistor R75 is set to 2.04 [kohm]. Consequently, as illustrated in FIG. 26B, it is possible to adjust the value of the equivalent resistance R2 to be 100 [kohm] in the operation mode M1, and to be 2 [kohm] in the operation mode M2. In other words, it is possible to adjust the value of the equivalent resistance R2 in the operation mode M2 to be 1/50 of the value thereof in the case of the operation mode M1.

Furthermore, in the loop filter 70, as illustrated in FIG. 26A, the capacitance value of the capacitor C81 is set to 1 [pF], and the capacitance value of the capacitor C73 is set to 50 [pF]. Consequently, as illustrated in FIG. 26B, it is possible to adjust the value of the equivalent capacitance C0 to be 1 [pF] in the operation mode M1, and to be 51 [pF] in the operation mode M2. In other words, it is possible to adjust the value of the equivalent capacitance C0 in the operation mode M2 to be about 50 times larger than the value thereof in the case of the operation mode M1.

Furthermore, in the loop filter 70, as illustrated in FIG. 26A, the capacitance value of each of the capacitors C73 and C78 is set to 50 [pF], and the capacitance value of the capacitor Cext is set to 4.7 [nF]. Consequently, as illustrated in FIG. 26B, it is possible to adjust the value of the equivalent capacitance C1 to be 100 [pF] in the operation mode M1, and to be 4.7 [nF] in the operation mode M2. In other words, it is possible to adjust the value of the equivalent capacitance C1 in the operation mode M2 to be 50 times larger than the value thereof in the case of the operation mode M1.

Furthermore, in the loop filter 70, as illustrated in FIG. 26A, the capacitance value of the capacitor C80 is set to 1 [pF], and the capacitance value of the capacitor C78 is set to 50 [pF]. Consequently, as illustrated in FIG. 26B, it is possible to adjust the value of the equivalent capacitance C2 to be 1 [pF] in the operation mode M1, and to be 51 [pF] in the operation mode M2. In other words, it is possible to adjust the value of the equivalent capacitance C2 in the operation mode M2 to be about 50 times larger than the value thereof in the case of the operation mode M1.

In this way, the value of each of the equivalent resistances R1 and R2 in the operation mode M2 is 1/50 of the value thereof in the case of the operation mode M1. The value of each of the equivalent capacitances C0 to C2 in the operation mode M2 is about 50 times larger than the value thereof in the case of the operation mode M1. Consequently, the transimpedance of the loop filter 70 in the operation mode M2 is about 1/50 of that in the case of the operation mode M1. On the other hand, the value of the current Icp in the operation mode M2 is 50 times larger than the value thereof in the case of the operation mode M1. Hence, substantially the same closed-loop transfer function is given regardless of the operation mode M1 or M2. Consequently, the phase locked loop circuit 3 achieves substantially the same response characteristics and stability between the operation modes M1 and M2.

Such a configuration also provides effects similar to those in the first embodiment.

[Modification 3-1]

The Modifications 1-1 to 1-3 of the first embodiment may each be applied to the loop filter 70 according to the third embodiment.

4. Application Examples

Application examples of the phase locked loop circuit described in any of the above-described embodiments and Modifications are now described.

Figure 27:
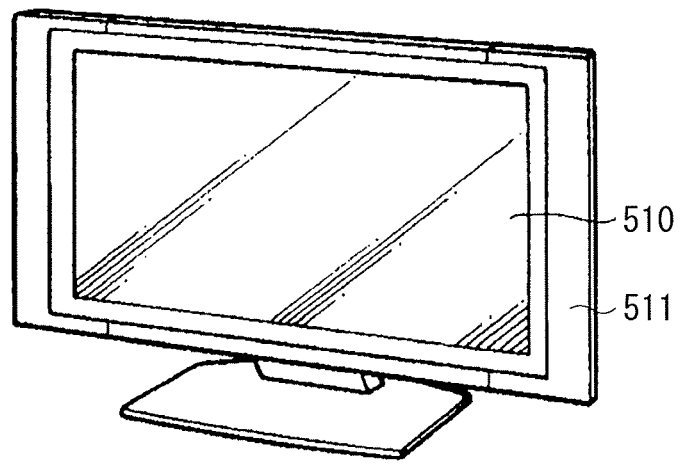
FIG. 27 is a perspective diagram illustrating an appearance configuration of a television unit to which any one of the embodiments is applied.

FIG. 27 illustrates appearance of a television unit to which the phase locked loop circuit of any of the above-described embodiments and Modifications is applied. For example, the television unit may include an image display screen section 510 and a body section 511. A tuner of the television unit may include the phase locked loop circuit according to any of the above-described embodiments and Modifications.

The phase locked loop circuit of any of the above-described embodiments and Modifications may be applied not only to such a television unit, but also electronic apparatuses in various fields, including units that perform communication in a wired or wireless manner, such as a smartphone and a mobile terminal device, measuring instruments, test equipment, and the like.

Although the present application has been described with the example embodiments, the Modifications thereof, and the application examples to electronic apparatuses hereinbefore, the technology is not limited thereto, and various modifications or alterations thereof may be made.

For example, although the second end of each of the capacitors C31, C32, C33, C37, C39, C54, C58, C59, C73, C78, C80, and C81 is grounded in the above-described embodiments and Modifications, this is not limitative. Alternatively, a DC voltage having a level different from the ground level may be applied to the second end. In addition, although the same voltage (the ground level) is applied to the second ends of such capacitors in the above-described embodiments and Modifications, this is not limitative. Alternatively, voltages different from one another may be applied to the respective second ends.

In addition, for example, although the closed-loop transfer functions CL(s) are substantially equalized between the operation modes M1 and M2 in the above-described embodiments and Modifications, this is not limitative. Alternatively, the closed-loop transfer functions CL(s) may be different from each other. In addition, although the same equivalent circuit configurations (topologies) are provided between the operation modes M1 and M2 in the above-described embodiments and Modifications, this is not limitative. Alternatively, equivalent circuit configurations different from each other may be provided. In addition, although the two operation modes M1 and M2 are provided in the above-described embodiments and Modifications, this is not limitative. Alternatively, three or more operation modes may be provided.

It is to be noted that the effects described in this specification are merely exemplified and not limitative, and other effects may be shown.

It is possible to achieve at least the following configurations from the above-described example embodiments of the disclosure.

(1) A phase locked loop circuit, including:
a phase comparison section configured to compare a phase of a first clock signal and a phase of a second clock signal;
a loop filter configured to generate a control voltage based on a comparison result by the phase comparison section; and
a clock signal generation section configured to generate a clock signal having a frequency corresponding to the control voltage, and output the clock signal as the second clock signal,
wherein the loop filter includes
a first resistor inserted between a first node on a signal path and a second node,
a first capacitor inserted between the second node and a first DC power supply,
a first switch inserted between the second node and a third node on the signal path, and
a second capacitor inserted between the third node and a second DC power supply.

(2) The phase locked loop circuit according to (1), wherein the third node is connected to the first node.

(3) The phase locked loop circuit according to (2), wherein the control voltage is a voltage at the first node.

(4) The phase locked loop circuit according to (2), wherein the loop filter further includes
a second resistor inserted between the first node as well as the third node and a fourth node on the signal path, and a third capacitor inserted between the fourth node and a third DC power supply.

(5) The phase locked loop circuit according to (4), wherein the control voltage is a voltage at the fourth node.

(6) The phase locked loop circuit according to (2), wherein the loop filter further includes
a second switch that is inserted between the second node and a fifth node, and is set to an on-off state different from an on-off state of the first switch,
a fourth capacitor inserted between the fifth node and a fourth DC power supply,
a third switch that is inserted between the fifth node and a sixth node on the signal path, and is set to an on-off state equal to the on-off state of the first switch,
a fifth capacitor inserted between the sixth node and a fifth DC power supply, and
a third resistor inserted between the first node and the sixth node.

(7) The phase locked loop circuit according to (6), wherein the third resistor is a variable resistor.

(8) The phase locked loop circuit according to any one of (2) to (7), wherein the loop filter further includes
a pad, and
a fourth resistor inserted between the first node and the pad.

(9) The phase locked loop circuit according to any one of (2) to (7), wherein the loop filter further includes
a pad,
a fourth switch that is inserted between the first node and a seventh node, and is set to an on-off state equal to the on-off state of the first switch, and
a fifth resistor inserted between the seventh node and the pad.

(10) The phase locked loop circuit according to (1), wherein the loop filter further includes
a sixth capacitor inserted between the first node and a sixth DC power supply,
a sixth resistor inserted between the first node and an eighth node, and
a fifth switch that is inserted between the eighth node and the third node, and is set to an on-off state different from the on-off state of the first switch.

(11) The phase locked loop circuit according to (10), wherein the first resistor is a variable resistor.

(12) The phase locked loop circuit according to (10) or (11), wherein the loop filter further includes a pad connected to the first node.

(13) The phase locked loop circuit according to (10) or (11), wherein the loop filter further includes
a pad, and
one of a seventh resistor, a sixth switch, and the seventh resistor and the sixth switch connected in series to each other, inserted between the first node and the pad.

(14) The phase locked loop circuit according to any one of (1) to (13), wherein the phase comparison section supplies a pulse current having a pulse width and a polarity corresponding to the comparison result to the loop filter.

(15) The phase locked loop circuit according to any one of (1) to (12), wherein the loop filter further includes an eighth resistor inserted between an output terminal of the phase comparison section and the first node, and
the phase comparison section outputs a pulse voltage having a pulse width corresponding to the comparison result from the output terminal.

(16) The phase locked loop circuit according to any one of (1) to (15), further including a control section configured to control an on-off state of the first switch, and switch a loop gain in correspondence to the on-off state.

(17) The phase locked loop circuit according to (16) wherein the phase comparison section supplies a pulse current having a pulse width and a polarity corresponding to the comparison result to the loop filter, and the control section switches the loop gain through altering a current value of the pulse current.

(18) A phase locked loop module, including:
   a phase locked loop circuit; and
   one or more individual components to be connected to the phase locked loop circuit,
   wherein the phase locked loop circuit includes
   a phase comparison section configured to compare a phase of a first clock signal and a phase of a second clock signal,
   a loop filter configured to generate a control voltage based on a comparison result by the phase comparison section, and
   a clock signal generation section configured to generate a clock signal having a frequency corresponding to the control voltage, and output the clock signal as the second clock signal,
   wherein the loop filter includes
   a first resistor inserted between a first node on a signal path and a second node,
   a first capacitor inserted between the second node and a first DC power supply,
   a first switch inserted between the second node and a third node on the signal path, and
   a second capacitor inserted between the third node and a second DC power supply.

(19) A phase locked loop method, including:
   comparing a phase of a first clock signal and a phase of a second clock signal, and supplying a result of the comparison to a loop filter, the loop filter including a first resistor inserted between a first node on a signal path and a second node, a first capacitor inserted between the second node and a first DC power supply, a first switch inserted between the second node and a third node on the signal path, and a second capacitor inserted between the third node and a second DC power supply;
   controlling the first switch to be on or off to generate a control voltage; and
   generating a clock signal having a frequency corresponding to the control voltage, and outputting the clock signal as the second clock signal.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A phase locked loop circuit, comprising:
   a phase comparison section configured to compare a phase of a first clock signal and a phase of a second clock signal;
   a loop filter configured to generate a control voltage based on a comparison result by the phase comparison section; and
   a clock signal generation section configured to generate a clock signal having a frequency corresponding to the control voltage, and output the clock signal as the second clock signal,
   wherein the loop filter includes
   a first resistor inserted between a first node on a signal path and a second node,
   a first capacitor inserted between the second node and a first DC power supply,
   a first switch inserted between the second node and a third node on the signal path, the third node being arranged on the signal path between an output terminal of a charge pump and the first node, and
   a second capacitor inserted between the third node and a second DC power supply,
   wherein the loop filter further comprises a second resistor,
   wherein the first resistor has a first end connected to a first end of the second capacitor, a first end of the second resistor, a first end of the first switch, the output terminal of the charge pump, and an input terminal of an oscillation circuit,
   wherein the first resistor has a second end connected to a first end of the first capacitor and to a second end of the first switch,
   wherein the first capacitor has a first end connected to the second end of the first resistor and the second end of the first switch, and has a second end being grounded,
   wherein the second capacitor has the first end connected to the first ends of each of the first and second resistors, the first end of the switch first, the output terminal of the charge pump, and the input terminal of the oscillation circuit,
   wherein the second capacitor has a second end being grounded,
   wherein the second resistor has the first end connected to the first end of the first resistor, the first end of the second capacitor, the first end of the first switch, the output terminal of the charge pump, and the input terminal of the oscillation circuit, and
   wherein the second resistor has a second end connected to a pad of a chip on which the phase locked loot circuit is provided.

2. The phase locked loop circuit according to claim 1, wherein the third node is connected to the first node.

3. The phase locked loop circuit according to claim 2, wherein the control voltage is a voltage at the first node.

4. The phase locked loop circuit according to claim 2, wherein the loop filter further includes
   a second resistor inserted between the first node as well as the third node and a fourth node on the signal path, and
   a third capacitor inserted between the fourth node and a third DC power supply.

5. The phase locked loop circuit according to claim 4, wherein the control voltage is a voltage at the fourth node.

6. The phase locked loop circuit according to claim 2, wherein the loop filter further includes
   a second switch that is inserted between the second node and a fifth node, and is set to an on-off state different from an on-off state of the first switch,
   a fourth capacitor inserted between the fifth node and a fourth DC power supply,
   a third switch that is inserted between the fifth node and a sixth node on the signal path, and is set to an on-off state equal to the on-off state of the first switch,
   a fifth capacitor inserted between the sixth node and a fifth DC power supply, and
   a third resistor inserted between the first node and the sixth node.

7. The phase locked loop circuit according to claim 6, wherein the third resistor is a variable resistor.

8. The phase locked loop circuit according to claim 2, wherein the loop filter further includes
   a pad, and
   a fourth resistor inserted between the first node and the pad.

9. The phase locked loop circuit according to claim 2, wherein the loop filter further includes
a pad,
a fourth switch that is inserted between the first node and a seventh node, and is set to an on-off state equal to the on-off state of the first switch, and
a fifth resistor inserted between the seventh node and the pad.

10. The phase locked loop circuit according to claim 1, wherein the loop filter further includes
a sixth capacitor inserted between the first node and a sixth DC power supply,
a sixth resistor inserted between the first node and an eighth node, and
a fifth switch that is inserted between the eighth node and the third node, and is set to an on-off state different from the on-off state of the first switch.

11. The phase locked loop circuit according to claim 10, wherein the first resistor is a variable resistor.

12. The phase locked loop circuit according to claim 10, wherein the loop filter further includes a pad connected to the first node.

13. The phase locked loop circuit according to claim 10, wherein the loop filter further includes
a pad, and
one of a seventh resistor, a sixth switch, and the seventh resistor and the sixth switch connected in series to each other, inserted between the first node and the pad.

14. The phase locked loop circuit according to claim 1, wherein the phase comparison section supplies a pulse current having a pulse width and a polarity corresponding to the comparison result to the loop filter.

15. The phase locked loop circuit according to claim 1, wherein the loop filter further includes an eighth resistor inserted between an output terminal of the phase comparison section and the first node, and
the phase comparison section outputs a pulse voltage having a pulse width corresponding to the comparison result from the output terminal.

16. The phase locked loop circuit according to claim 1, further comprising a control section configured to control an on-off state of the first switch, and switch a loop gain in correspondence to the on-off state.

17. The phase locked loop circuit according to claim 16 wherein the phase comparison section supplies a pulse current having a pulse width and a polarity corresponding to the comparison result to the loop filter, and
the control section switches the loop gain through altering a current value of the pulse current.

18. The phase locked loop circuit according to claim 1, wherein the phase locked loop circuit is configured for two operation modes M1 and M2, the operation mode M1 is a mode of operation without providing external components, and the operation mode M2 is a mode where an external capacitor Cext is used as an external component to allow phase noise of the clock signal output from the clock signal generation section to be reduced.

19. A phase locked loop module, comprising:
a phase locked loop circuit; and
one or more individual components to be connected to the phase locked loop circuit,
wherein the phase locked loop circuit includes
a phase comparison section configured to compare a phase of a first clock signal and a phase of a second clock signal,
a loop filter configured to generate a control voltage based on a comparison result by the phase comparison section, and
a clock signal generation section configured to generate a clock signal having a frequency corresponding to the control voltage, and output the clock signal as the second clock signal,
wherein the loop filter includes
a first resistor inserted between a first node on a signal path and a second node,
a first capacitor inserted between the second node and a first DC power supply,
a first switch inserted between the second node and a third node on the signal path, the third node being arranged on the signal path between an output terminal of a charge pump and the first node, and
a second capacitor inserted between the third node and a second DC power supply,
wherein the loop filter further comprises a second resistor,
wherein the first resistor has a first end connected to a first end of the second capacitor, a first end of the second resistor, a first end of the first switch, the output terminal of the charge flap, and an input terminal of an oscillation circuit,
wherein the first resistor has a second end connected to a first end of the first capacitor and to a second end of the first switch,
wherein the first capacitor has a first end connected to the second end of the first resistor and the second end of the first switch, and has a second end being grounded,
wherein the second capacitor has the first end connected to the first ends of each of the first and second resistors, the first end of the switch first, the output terminal of the charge pump, and the input terminal of the oscillation circuit,
wherein the second capacitor has a second end being grounded,
wherein the second resistor has the first end connected to the first end of the first resistor, the first end of the second capacitor, the first end of the first switch, the output terminal of the charge pump, and the input terminal of the oscillation circuit, and
wherein the second resistor has a second end connected to a pad of a chip on which the phase locked loop circuit is provided.

20. A phase locked loop method, comprising:
comparing a phase of a first clock signal and a phase of a second clock signal, and supplying a result of the comparison to a loop filter, the loop filter including a first resistor inserted between a first node on a signal path and a second node, a first capacitor inserted between the second node and a first DC power supply, a first switch inserted between the second node and a third node on the signal path, the third node being arranged on the signal path between an output terminal of a charge pump and the first node, and a second capacitor inserted between the third node and a second DC power supply;
controlling the first switch to be on or off to generate a control voltage; and
generating a clock signal having a frequency corresponding to the control voltage, and outputting the clock signal as the second clock signal,
wherein the loop filter further comprises a second resistor,
wherein the first resistor has a first end connected to a first end of the second capacitor, a first end of the second resistor, a first end of the first switch, the output terminal of the charge pump, and an input terminal of an oscillation circuit, wherein the first resistor has a second end connected to a first end of the first capacitor and to a second end of the first switch, wherein the first capacitor has a first end connected to the second end of the first resistor and the second end of the first switch, and has a second end being grounded, wherein the second capacitor has the first end connected to the first ends of each of the first and second resistors, the first end of the switch first, the output terminal of the charge pump, and the input terminal of the oscillation circuit, wherein the second capacitor has a second end being grounded, wherein the second resistor has the first end connected to the first end of the first resistor, the first end of the second capacitor, the first end of the first switch, the output terminal of the charge pump, and the input terminal of the oscillation circuit, and wherein the second resistor has a second end connected to a pad of a chip on which the phase locked loop circuit is provided.

* * * * *